US011528443B2

(12) United States Patent
Okada et al.

(10) Patent No.: US 11,528,443 B2
(45) Date of Patent: Dec. 13, 2022

(54) IMAGING DEVICE AND IMAGING METHOD

(71) Applicant: Panasonic Intellectual Property Management Co., Ltd., Osaka (JP)

(72) Inventors: Yusuke Okada, Osaka (JP); Takeyoshi Tokuhara, Osaka (JP); Yoshiaki Satou, Kyoto (JP); Yasuo Miyake, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 53 days.

(21) Appl. No.: 17/098,505

(22) Filed: Nov. 16, 2020

(65) Prior Publication Data

US 2021/0084248 A1    Mar. 18, 2021

Related U.S. Application Data

(63) Continuation of application No. PCT/JP2019/023824, filed on Jun. 17, 2019.

(30) Foreign Application Priority Data

Sep. 14, 2018  (JP) .............................. JP2018-172878

(51) Int. Cl.
*H04N 5/378* (2011.01)
*H01L 27/146* (2006.01)
(Continued)

(52) U.S. Cl.
CPC ....... *H04N 5/378* (2013.01); *H01L 27/14612* (2013.01); *H01L 27/14636* (2013.01);
(Continued)

(58) Field of Classification Search
CPC .. H04N 5/378; H04N 5/35581; H04N 5/3698; H04N 5/35572; H04N 5/3559;
(Continued)

(56) References Cited

U.S. PATENT DOCUMENTS

2004/0183109 A1    9/2004 Kuriyama
2005/0067640 A1    3/2005 Ohkawa
(Continued)

FOREIGN PATENT DOCUMENTS

JP    2006-074063    3/2006
JP    2007-104114    4/2007
(Continued)

OTHER PUBLICATIONS

International Search Report of PCT application No. PCT/JP2019/023824 dated Aug. 20, 2019.

*Primary Examiner* — Albert H Cutler
(74) *Attorney, Agent, or Firm* — McDermott Will & Emery LLP

(57) ABSTRACT

An imaging device 100 includes a pixel array PA. A first period, a third period, and a second period appear in this order in one frame. During the first period, pixel signal readout is performed on at least one first row in the pixel array PA. During the second period, pixel signal readout is performed on at least one second row in the pixel array PA. At least one of the at least one first row or the at least one second row includes two rows in the pixel array PA. During the third period, no pixel signal readout is performed on the rows in the pixel array PA. Each of the first period and the second period is one of the high-sensitivity exposure period and the low-sensitivity exposure period. The third period is the other of the high-sensitivity exposure period and the low-sensitivity exposure period.

20 Claims, 17 Drawing Sheets

(51) Int. Cl.
*H01L 27/148* (2006.01)
*H04N 5/355* (2011.01)
*H04N 5/369* (2011.01)
*H04N 5/374* (2011.01)

(52) U.S. Cl.
CPC .. *H01L 27/14643* (2013.01); *H01L 27/14665* (2013.01); *H01L 27/14831* (2013.01); *H04N 5/35581* (2013.01); *H04N 5/3698* (2013.01)

(58) Field of Classification Search
CPC .... H04N 5/374; H04N 5/355; H04N 5/35563; H01L 27/14612; H01L 27/14636; H01L 27/14643; H01L 27/14831; H01L 27/14609
USPC ........................................................ 348/296
See application file for complete search history.

(56) References Cited

U.S. PATENT DOCUMENTS

| | | |
|---|---|---|
| 2007/0076108 A1 | 4/2007 | Misawa |
| 2008/0055439 A1 | 3/2008 | Mabuchi |
| 2008/0173794 A1* | 7/2008 | Oike ................... H04N 5/35563 348/E3.018 |
| 2013/0242152 A1* | 9/2013 | Kasai ................... H04N 5/2353 348/294 |
| 2014/0218575 A1* | 8/2014 | Yanai ................... H04N 5/3532 348/296 |
| 2015/0207974 A1* | 7/2015 | Mody ................ H04N 5/35581 348/296 |
| 2015/0326806 A1* | 11/2015 | Moriwaka ............. H04N 5/347 348/302 |
| 2016/0360134 A1* | 12/2016 | Miyake .............. H01L 27/14638 |
| 2017/0214870 A1* | 7/2017 | Miyake ................ H04N 5/3745 |

FOREIGN PATENT DOCUMENTS

| | | |
|---|---|---|
| JP | 2008-085972 | 4/2008 |
| JP | 2010-283859 | 12/2010 |
| JP | 2016-086407 | 5/2016 |
| JP | 2017-005051 | 1/2017 |
| JP | 2017-135704 | 8/2017 |

\* cited by examiner

IMAGING DEVICE AND IMAGING METHOD

BACKGROUND

1. Technical Field

The present disclosure relates to an imaging device and an imaging method.

2. Description of the Related Art

In the related art, the luminance of an image output from an imaging device has been adjusted. The luminance is adjusted in accordance with, for example, the illuminance of a subject or the like.

The luminance can be adjusted by, for example, adjusting the amount of light that is incident on an imaging element. The amount of incident light can be adjusted by, for example, adjusting the diaphragm of a lens, adjusting the exposure time of a shutter, reducing light by using a neutral density (ND) filter, or the like.

The luminance can also be adjusted by, for example, adjusting the sensitivity of the imaging element. Adjustment of the sensitivity of the imaging element adjusts the amount of positive or negative charge to be read from the imaging element. The adjustment of the amount of charge adjusts the luminance of an output image. Japanese Unexamined Patent Application Publication No. 2007-104114 and Japanese Unexamined Patent Application Publication No. 2017-135704 describe an imaging element with an adjustable sensitivity.

In the imaging element in Japanese Unexamined Patent Application Publication No. 2007-104114 and Japanese Unexamined Patent Application Publication No. 2017-135704, a voltage is applied to a photoelectric conversion layer. By controlling the time range for the voltage application, the sensitivity of the imaging element is adjusted.

SUMMARY

There is room for improvement of imaging devices of the related art for obtaining an appropriate image while maintaining a frame rate. The present disclosure provides a technique suitable for obtaining an appropriate image while maintaining a frame rate.

In one general aspect, the techniques disclosed here feature an imaging device including a pixel array. A first period, a third period, and a second period appear in this order in one frame. During the first period, pixel signal readout is performed on at least one first row in the pixel array. During the second period, pixel signal readout is performed on at least one second row in the pixel array. At least one selected from the group consisting of the at least one first row and the at least one second row includes two rows in the pixel array. Each of the first period and the second period is one of a high-sensitivity exposure period and a low-sensitivity exposure period. The third period is the other of the high-sensitivity exposure period and the low-sensitivity exposure period.

The technique according to the present disclosure is suitable for obtaining an appropriate image while maintaining a frame rate.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Overview of Aspects of Present Disclosure

Figure 1:
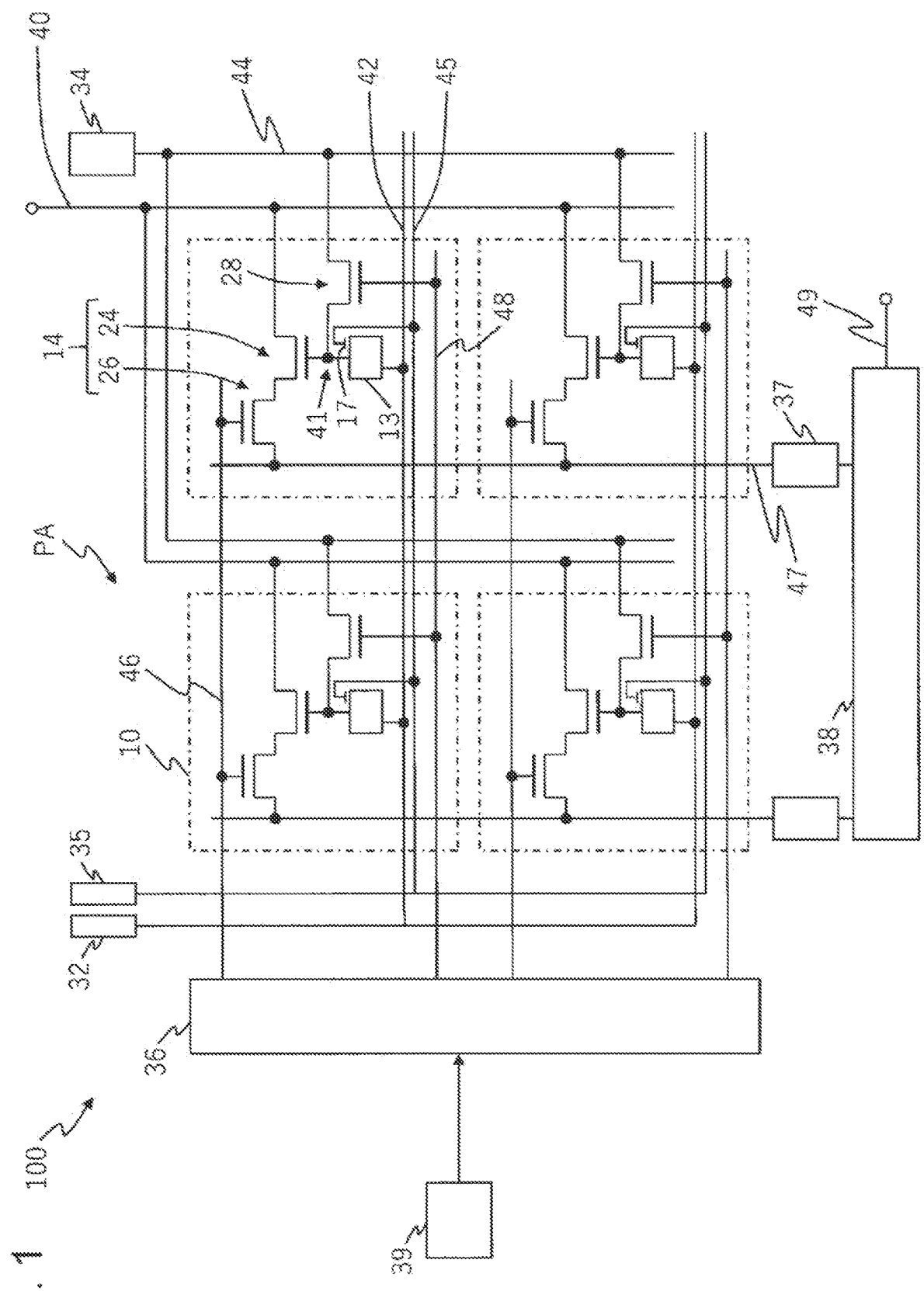
FIG. 1 schematically illustrates an imaging device.

An imaging device according to a first aspect of the present disclosure is an imaging device including:

a pixel array, in which a first period, a third period, and a second period appear in this order in one frame, in which, during the first period, pixel signal readout is performed on at least one first row in the pixel array, in which, during the second period, pixel signal readout is performed on at least one second row in the pixel array, in which at least one selected from the group consisting of the at least one first row and the at least one second row includes two rows in the pixel array, in which each of the first period and the second period is one of a high-sensitivity exposure period and a low-sensitivity exposure period, and in which the third period is the other of the high-sensitivity exposure period and the low-sensitivity exposure period.

The technique according to the first aspect is suitable for obtaining an appropriate image while maintaining a frame rate. Note that no pixel signal readout may be performed on the rows in the pixel array during the third period.

According to a second aspect of the present disclosure, for example, in the imaging device according to the first aspect, the at least one first row may include two rows, and the at least one second row may include two rows.

The technique according to the second aspect is advantageous in terms of maintaining the frame rate.

According to a third aspect of the present disclosure, for example, in the imaging device according to the second aspect, the at least one first row may be constituted by rows a number of which is equal to a number of rows constituting the at least one second row.

The technique according to the third aspect is advantageous in terms of capturing an appropriate image of a subject that changes over time.

According to a fourth aspect of the present disclosure, for example, in the imaging device according to any one of the first to third aspects, each of the first period and the second period may be the high-sensitivity exposure period, and the third period may be the low-sensitivity exposure period.

The technique according to the fourth aspect is suitable for image capturing with a high sensitivity.

According to a fifth aspect of the present disclosure, for example, in the imaging device according to any one of the first to third aspects, each of the first period and the second period may be the low-sensitivity exposure period, and the third period may be the high-sensitivity exposure period.

The technique according to the fifth aspect is suitable for image capturing with a low sensitivity.

According to a sixth aspect of the present disclosure, for example, the imaging device according to any one of the first to third aspects may have a control mode that is either a first mode or a second mode. In the first mode, each of the first period and the second period may be the high-sensitivity exposure period, and the third period may be the low-sensitivity exposure period. In the second mode, each of the first period and the second period may be the low-sensitivity exposure period, and the third period may be the high-sensitivity exposure period.

The first mode is suitable for image capturing with a high sensitivity. The second mode is suitable for image capturing with a low sensitivity. Thus, the sixth aspect enables image capturing suitable for both cases.

According to a seventh aspect of the present disclosure, for example, in the imaging device according to any one of the first to sixth aspects, a total period of the high-sensitivity exposure period may be longer than or equal to a total period of the low-sensitivity exposure period in the one frame.

The technique according to the seventh aspect helps image capturing with a high sensitivity.

According to an eighth aspect of the present disclosure, for example, in the imaging device according to any one of the first to sixth aspects, a total period of the high-sensitivity exposure period may be shorter than a total period of the low-sensitivity exposure period in the one frame.

The technique according to the eighth aspect helps image capturing with a low sensitivity.

According to a ninth aspect of the present disclosure, for example, the imaging device according to any one of the first to eighth aspects may further include a semiconductor substrate and a photoelectric converter. The photoelectric converter may include a photoelectric conversion layer, a first electrode, and a second electrode. The semiconductor substrate, the first electrode, the photoelectric conversion layer, and the second electrode may be stacked in this order.

The ninth aspect can form an imaging element with an easily adjustable sensitivity.

According to a tenth aspect of the present disclosure, for example, the imaging device according to the ninth aspect may have the following feature (i) and/or (ii): (i) the imaging device further includes a third electrode, the semiconductor substrate, the third electrode, the photoelectric conversion layer, and the second electrode are stacked in this order, and the imaging device controls the third electrode to have a different voltage during the high-sensitivity exposure period and during the low-sensitivity exposure period; and (ii) the imaging device controls the second electrode to have a different voltage during the high-sensitivity exposure period and during the low-sensitivity exposure period.

Control of the voltage(s) of the electrode(s) as in the tenth aspect enables adjustment of the sensitivity.

According to an eleventh aspect of the present disclosure, for example, the imaging device according to the tenth aspect may have the following feature (I) and/or (II): (I) in the feature (i), the third period is longer than or equal to twice a time constant in voltage change of the third electrode; and (II) in the feature (ii), the third period is longer than or equal to twice a time constant in voltage change of the second electrode.

According to the eleventh aspect, during the third period, even if the presence of the time constant is taken into account, the voltage(s) of the electrode(s) may be sufficiently close to an expected value. This is advantageous in terms of obtaining a desired sensitivity.

An imaging method according to a twelfth aspect of the present disclosure is an imaging method using an imaging device including a pixel array in which a first period, a third period, and a second period appear in this order in one frame, the method including:

during the first period, performing pixel signal readout on at least one first row in the pixel array; and during the second period, performing pixel signal readout on at least one second row in the pixel array, in which at least one of the at least one first row or the at least one second row includes two rows in the pixel array, in which each of the first period and the second period is one of a high-sensitivity exposure period and a low-sensitivity exposure period, and in which the third period is the other of the high-sensitivity exposure period and the low-sensitivity exposure period.

The technique according to the twelfth aspect is suitable for obtaining an appropriate image while maintaining a frame rate. Note that no pixel signal readout may be performed on the rows in the pixel array during the third period.

An imaging device according to a thirteenth aspect of the present disclosure includes:

a signal line;

a plurality of pixels that generate pixel signals in accordance with amounts of incident light, respectively, and that sequentially output the pixel signals to the signal line; and a voltage supply circuit that supplies a first voltage and a second voltage concurrently to each of the plurality of pixels, the first voltage and the second voltage being different from each other and being to be supplied alternately twice or more during a first frame period, in which each of the plurality of pixels includes a photoelectric converter that converts light into an electric signal with a first sensitivity during a first period during which the first voltage is supplied and converts light into an electric signal with a second sensitivity during a second period during which the second voltage is supplied, the first sensitivity and the second sensitivity being different from each other, and a first transistor that amplifies each of the electric signals and outputs a corresponding one of the pixel signals, and in which at least two pixels of the plurality of pixels sequentially output the pixel signals to the signal line during a period in the first period in the first frame period.

According to a fourteenth aspect of the present disclosure, for example, in the imaging device according to the thirteenth aspect, the plurality of pixels may output the pixel signals, respectively, to the signal line during the first period in the first frame period.

According to a fifteenth aspect of the present disclosure, for example, in the imaging device according to the thirteenth or fourteenth aspect, the plurality of pixels may not output the pixel signals, respectively, to the signal line during the second period in the first frame period.

According to a sixteenth aspect of the present disclosure, for example, in the imaging device according to the thirteenth aspect, the photoelectric converter in each of the plurality of pixels may include a first electrode to be electrically connected to a gate of the first transistor, a second electrode facing the first electrode, and a photoelectric conversion layer between the first electrode and the second electrode, and the voltage supply circuit may alternately supply the first voltage and the second voltage to the second electrode in the photoelectric converter in each of the plurality of pixels.

According to a seventeenth aspect of the present disclosure, for example, in the imaging device according to the thirteenth aspect, the photoelectric converter in each of the plurality of pixels may include a photoelectric conversion layer having a first surface and a second surface, the first surface and the second surface being opposite to each other, a first electrode located on the first surface, a third electrode located on the first surface, and a second electrode located on the second surface and facing the first electrode and the third electrode, the first electrode may be to be electrically connected to a gate of the first transistor, and the voltage supply circuit may alternately supply the first voltage and the second voltage to the third electrode in the photoelectric converter in each of the plurality of pixels.

According to an eighteenth aspect of the present disclosure, for example, in the imaging device according to the thirteenth aspect, the photoelectric converter in each of the plurality of pixels may include a photodiode, each of the plurality of pixels may include a second transistor having one of a source and a drain to be electrically connected to the photodiode and the other of the source and the drain to be electrically connected to a gate of the first transistor, and a third transistor having one of a source and a drain to be electrically connected to the photodiode and the other of the source and the drain to be supplied with a predetermined voltage, and the voltage supply circuit may alternately supply the first voltage and the second voltage to a gate of the third transistor.

According to a nineteenth aspect of the present disclosure, for example, in the imaging device according to the eighteenth aspect, the voltage supply circuit may alternately supply a third voltage and a fourth voltage to a gate of the second transistor, the third voltage and the fourth voltage being different from each other.

According to a twentieth aspect of the present disclosure, for example, the imaging device according to any one of the thirteenth to nineteenth aspects may further include: a first control circuit that causes the voltage supply circuit to supply the first voltage and the second voltage; and a second control circuit that causes the plurality of pixels to sequentially output the pixel signals, respectively, to the signal line.

An imaging device according to a twenty-first aspect of the present disclosure is an imaging device including:

a pixel array, in which a first period and a third period appear in this order in one frame, in which, during the first period, pixel signal readout is performed on at least one first row in the pixel array, in which, during the third period, pixel signal readout is performed on at least one third row in the pixel array, in which there is no row in the pixel array on which pixel signal readout is performed over a period across the boundary between the first period and the third period, in which the first period is one of a high-sensitivity exposure period and a low-sensitivity exposure period, and in which the third period is the other of the high-sensitivity exposure period and the low-sensitivity exposure period.

The technique according to the twenty-first aspect is suitable for obtaining an appropriate image while maintaining a frame rate.

An imaging method according to a twenty-second aspect of the present disclosure is an imaging method using an imaging device including a pixel array in which a first period and a third period appear in this order in one frame, the method including:

during the first period, performing pixel signal readout on at least one first row in the pixel array; and during the third period, performing pixel signal readout on at least one third row in the pixel array, in which there is no row in the pixel array on which pixel signal readout is performed over a period across the boundary between the first period and the third period, in which the first period is one of a high-sensitivity exposure period and a low-sensitivity exposure period, and in which the third period is the other of the high-sensitivity exposure period and the low-sensitivity exposure period.

The technique according to the twenty-second aspect is suitable for obtaining an appropriate image while maintaining a frame rate.

The term "high-sensitivity exposure period" and the term "low-sensitivity exposure period" are used herein. The high-sensitivity exposure period indicates a period during which a higher sensitivity is obtained than during the low-sensitivity exposure period. The low-sensitivity exposure period indicates a period during which a lower sensitivity is obtained than during the high-sensitivity exposure period. The sensitivity being low herein is a concept including the sensitivity being zero. The low-sensitivity exposure period is a concept including a period during which the sensitivity is zero.

Ordinals such as first, second, and third may be used herein. An element with an ordinal does not necessarily require the presence of an element of the same kind with a smaller ordinal.

Now, embodiments of the present disclosure will be described in detail with reference to the drawings. Note that the embodiments described below illustrate general or specific examples. Any numeric value, shape, material, structural element, arrangement and connection of structural elements, step, order of steps, and the like illustrated in the following embodiments are examples and do not intend to limit the present disclosure. Various embodiments described herein can be combined with each other without inconsistency. In addition, among structural elements in the following embodiments, those not described in the broadest independent claim are optional. Furthermore, in the following description, structural elements having substantially the same function are denoted by the same reference numerals and may not be repeatedly described.

For simplicity of the drawings, the influence of a time constant is neglected in some drawings. On the other hand, the influence of a time constant is taken into account in FIGS. 8 and 9.

First Embodiment

Circuit Configuration of Imaging Device

FIG. 1 illustrates an exemplary circuit configuration of an imaging device according to a first embodiment. An imaging device 100 illustrated in FIG. 1 includes a pixel array PA including a plurality of unit pixels 10 that are arrayed two-dimensionally. FIG. 1 schematically illustrates an example in which the unit pixels 10 are arranged in a matrix of two rows and two columns. It is needless to say that the number and arrangement of the unit pixels 10 in the imaging device 100 are not limited to those in the example illustrated in FIG. 1.

Each of the unit pixels 10 includes a photoelectric conversion section 13 and a signal detection circuit 14. As will be described later with reference to a drawing, the photoelectric conversion section 13 includes a photoelectric conversion layer sandwiched between two electrodes facing each other and generates a signal by receiving incident light. The entirety of the photoelectric conversion section 13 does not need to be an element that is independent for each of the unit pixels 10, and, for example, part of the photoelectric conversion section 13 may be formed across the plurality of unit pixels 10. The signal detection circuit 14 is a circuit that detects the signal generated by the photoelectric conversion section 13. In this example, the signal detection circuit 14 includes a signal detection transistor 24 and an address transistor 26. Each of the signal detection transistor 24 and the address transistor 26 is typically a field-effect transistor (FET) and is an N-channel metal oxide semiconductor (MOS) transistor in this example.

As schematically illustrated in FIG. 1, a control terminal (gate in this example) of the signal detection transistor 24 has an electrical connection with the photoelectric conversion section 13. Signal charge (holes or electrons) generated by the photoelectric conversion section 13 is accumulated in a charge accumulation section 41. The charge accumulation section 41 spreads in a region including a region between the gate of the signal detection transistor 24 and the photoelectric conversion section 13. The charge accumulation section 41 includes so-called floating diffusion. Details of the structure of the photoelectric conversion section 13 will be described later.

The imaging device 100 includes a driving section that drives the pixel array PA and acquires images at a plurality of timings. The driving section includes a voltage supply circuit 32, a voltage supply circuit 35, a reset voltage source 34, a vertical scanning circuit 36, column signal processing circuits 37, a horizontal signal reading circuit 38, and a pixel-driving-signal generating circuit 39.

The photoelectric conversion section 13 in each of the unit pixels 10 further has a connection with a sensitivity control line 42. In the configuration illustrated in FIG. 1, the sensitivity control line 42 is connected to the voltage supply circuit 32. As will be described later in detail, the voltage supply circuit 32 supplies a voltage to a counter electrode 12 (see FIG. 2), the voltage being different during a high-sensitivity exposure period and during a low-sensitivity exposure period. The voltage supplied to the counter electrode 12 may be different in frames.

As will be described later, the photoelectric conversion section 13 includes a pixel electrode 11 and a photoelectric conversion layer 15 in addition to the counter electrode 12. In addition, in the configuration illustrated in FIG. 1, a shield electrode 17 has a connection with a sensitivity control line 45. The sensitivity control line 45 is connected to the voltage supply circuit 35. The voltage supply circuit 35 supplies a shield voltage to the shield electrode 17. Typically, the shield electrode 17 and the pixel electrode 11 are electrically isolated from each other. In the example in FIGS. 1 and 2, the shield electrode 17 and the pixel electrode 11 are separated from each other. In this example, the shield electrode 17 and the pixel electrode 11 are in contact with a surface of the photoelectric conversion layer 15, and the counter electrode 12 is in contact with the other surface of the photoelectric conversion layer 15.

The shield voltage in the shield electrode 17 may be used to suppress crosstalk between the unit pixels 10. For example, crosstalk may be suppressed by applying the shield voltage to the shield electrode 17, the shield voltage being lower than a reset voltage Vr applied to the pixel electrode 11. The shield voltage applied to the shield electrode 17 may be a negative voltage.

When viewed in the thickness direction of the pixel electrode 11, that is, in a plan view, the shield electrode 17 may surround the pixel electrode 11. More specifically, a plurality of through-holes may be provided in the shield electrode 17, and each pixel electrode 11 may be included in a corresponding one of the through-holes. The shield electrode 17 may be a single electrode or may be constituted by a plurality of electrodes that are separated from one another.

Note that the sensitivity control line 45 and the voltage supply circuit 35 may be omitted, and the shield electrode 17 may be connected to ground of the imaging device 100. Also in this manner, crosstalk may be suppressed. In addition, the shield electrode 17, the sensitivity control line 45, and the voltage supply circuit 35 may be omitted. The same applies to a second embodiment.

During "high-sensitivity exposure period" in the first embodiment, one of positive charge and negative charge (signal charge) generated through photoelectric conversion is accumulated in the charge accumulation section 41 with a relatively high sensitivity. That is, during "high-sensitivity exposure period", light is converted into an electric signal with a relatively high sensitivity. In addition, during "low-sensitivity exposure period" in the first embodiment, one of positive charge and negative charge (signal charge) generated through photoelectric conversion is accumulated in the charge accumulation section 41 with a relatively low sensitivity. That is, during "low-sensitivity exposure period", light is converted into an electric signal with a relatively low sensitivity. The sensitivity being low includes the sensitivity being zero. The same applies to the following second and third embodiments.

By controlling the potential of the counter electrode 12 with respect to the potential of the pixel electrode 11, it is possible to collect, in the pixel electrode 11, one of holes and electrons from hole-electron pairs generated in the photoelectric conversion layer 15 through photoelectric conversion. For example, in a case of using holes as signal charge, it is possible to selectively collect holes in the pixel electrode 11 by making the potential of the counter electrode 12 higher than that of the pixel electrode 11. The amount of signal charge collected per unit time varies depending on the potential difference between the pixel electrode 11 and the counter electrode 12. A case of using holes as signal charge will be described below. As a matter of course, electrons may also be used as signal charge. Each of the voltage supply circuit 32 and the voltage supply circuit 35 is not limited to a specific power source circuit and may be a circuit that generates a predetermined voltage or a circuit that converts a voltage supplied from another power source to a predetermined voltage.

Each of the unit pixels 10 has a connection with a power source line 40 that supplies a power source voltage VDD. As illustrated, an input terminal (typically, drain) of the signal detection transistor 24 is connected to the power source line 40. By the power source line 40 serving as a source follower power source, the signal detection transistor 24 amplifies and outputs a signal generated by the photoelectric conversion section 13.

An input terminal (drain in this example) of the address transistor 26 is connected to an output terminal (source in this example) of the signal detection transistor 24. An output terminal (source in this example) of the address transistor 26 is connected to a vertical signal line 47, which is one of a plurality of vertical signal lines 47 arranged for the respective columns of the pixel array PA. A control terminal (gate in this example) of the address transistor 26 is connected to an address control line 46, and by controlling the potential of the address control line 46, an output of the signal detection transistor 24 can be selectively read out to the corresponding vertical signal line 47.

In the illustrated example, the address control line 46 is connected to the vertical scanning circuit (also referred to as "row scanning circuit") 36. By applying a predetermined voltage to the address control line 46, the vertical scanning circuit 36 selects, in units of row, the plurality of unit pixels 10 arranged in each row. Thus, signal readout and reset of pixel electrodes 11, which will be described later, are performed on the selected unit pixels 10.

Furthermore, the pixel-driving-signal generating circuit 39 is connected to the vertical scanning circuit 36. In the illustrated example, the pixel-driving-signal generating circuit 39 generates signals for driving the unit pixels 10 arranged in the respective rows of the pixel array PA. The generated pixel driving signals are supplied to the unit pixels 10 in the row selected by the vertical scanning circuit 36.

The vertical signal lines 47 are main signal lines for transmitting pixel signals from the pixel array PA to peripheral circuits. The column signal processing circuits (also referred to as "row signal accumulating circuits") 37 are connected to the vertical signal lines 47. The column signal processing circuits 37 perform noise suppressing signal processing, analog-to-digital conversion (AD conversion), and the like. The noise suppressing signal processing is typified by correlated double sampling. As illustrated, the column signal processing circuits 37 are provided to correspond to the respective columns of the unit pixels 10 in the pixel array PA. The horizontal signal reading circuit (also referred to as "column scanning circuit") 38 is connected to these column signal processing circuits 37. The horizontal signal reading circuit 38 sequentially reads out signals from the plurality of column signal processing circuits 37 and outputs them to a horizontal common signal line 49.

In the configuration illustrated in FIG. 1, each of the unit pixels 10 includes a reset transistor 28. Similarly to the signal detection transistor 24 and the address transistor 26, the reset transistor 28 may be, for example, an FET. The following description illustrates an example of applying an N-channel MOS transistor to the reset transistor 28 unless otherwise specified. As illustrated, the reset transistor 28 is connected between a reset voltage line 44 for supplying a reset voltage Vr and the charge accumulation section 41. A control terminal (gate in this example) of the reset transistor 28 is connected to a reset control line 48, and by controlling the potential of the reset control line 48, the potential of the charge accumulation section 41 can be reset to the reset voltage Vr. In this example, the reset control line 48 is connected to the vertical scanning circuit 36. Thus, by the vertical scanning circuit 36 applying a predetermined voltage to the reset control line 48, the plurality of unit pixels 10 arranged in the respective rows can be reset in units of row.

In this example, the reset voltage line 44 for supplying the reset voltage Vr to the reset transistor 28 is connected to the reset voltage supply circuit (hereinafter simply referred to as "reset voltage source") 34. The reset voltage source 34 may have any configuration that can supply the predetermined reset voltage Vr to the reset voltage line 44 during the operation of the imaging device 100, and is not limited to a specific power source circuit similarly to the voltage supply circuit 32 described above. Each of the voltage supply circuit 32, the voltage supply circuit 35, and the reset voltage source 34 may be part of a single voltage supply circuit or independent, separate voltage supply circuits. Note that at least one of the voltage supply circuit 32, the voltage supply circuit 35, or the reset voltage source 34 may be part of the vertical scanning circuit 36. Alternatively, a sensitivity control voltage from the voltage supply circuit 32, a sensitivity control voltage from the voltage supply circuit 35, and/or the reset voltage Vr from the reset voltage source 34 may be supplied to the unit pixels 10 through the vertical scanning circuit 36.

It is also possible to use the power source voltage VDD of the signal detection circuit 14 as the reset voltage Vr. In this case, a voltage supply circuit (not illustrated in FIG. 1) that supplies the power source voltage to the unit pixels 10 and the reset voltage source 34 may be shared. In addition, since the power source line 40 and the reset voltage line 44 may be shared, wiring in the pixel array PA may be simplified. Note that the reset voltage Vr being a voltage different from the power source voltage VDD of the signal detection circuit 14 enables more flexible control of the imaging device 100.

Device Structure of Unit Pixel

Figure 2:
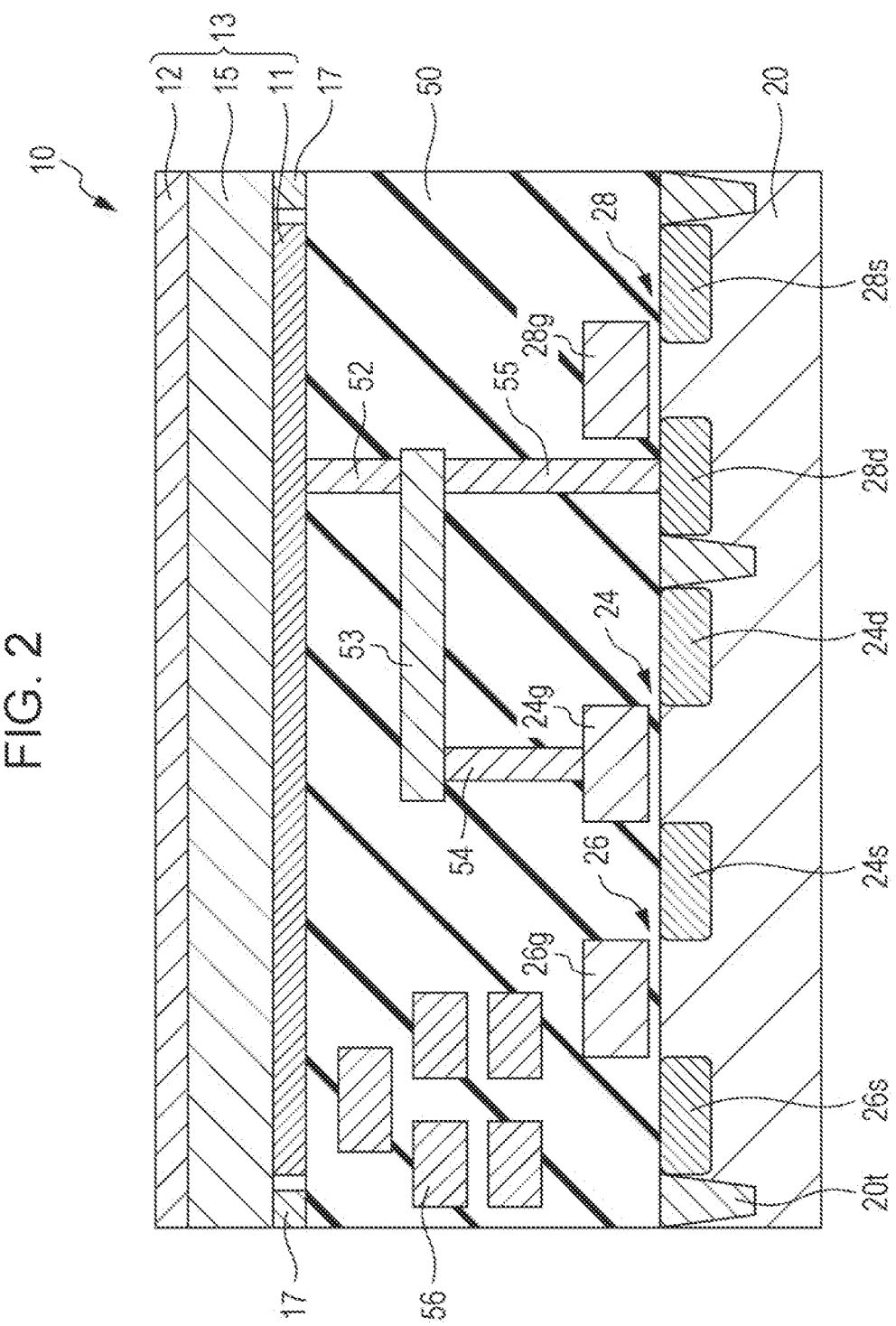
FIG. 2 is a schematic cross-sectional view of a device structure of a unit pixel.

FIG. 2 schematically illustrates an exemplary device structure of a unit pixel 10. In the structure illustrated in FIG. 2, the signal detection transistor 24, the address transistor 26, and the reset transistor 28 are formed on a semiconductor substrate 20. The semiconductor substrate 20 is not limited to a substrate the entirety of which is a semiconductor. The semiconductor substrate 20 may also be an insulating substrate having a surface on which a semiconductor layer is formed and on which a sensitive region is to be formed. In this example, a P-type silicon (Si) substrate is used as the semiconductor substrate 20.

The semiconductor substrate 20 includes impurity regions (N-type regions in this example) 26s, 24s, 24d, 28d, and 28s and an element isolation region 20t for electric isolation between the unit pixels 10. In this example, the element isolation region 20t is also provided between the impurity region 24d and the impurity region 28d. The element isolation region 20t is formed by, for example, implantation of acceptor ions under predetermined implantation conditions.

The impurity regions 26s, 24s, 24d, 28d, and 28s are typically diffusion layers formed in the semiconductor substrate 20. As schematically illustrated in FIG. 2, the signal detection transistor 24 includes the impurity region 24s, the impurity region 24d, and a gate electrode 24g (typically, a polysilicon electrode). The impurity region 24s serves as, for example, a source region of the signal detection transistor 24. The impurity region 24d serves as, for example, a drain region of the signal detection transistor 24. A channel region of the signal detection transistor 24 is formed between the impurity region 24s and the impurity region 24d.

Similarly, the address transistor 26 includes the impurity region 26s, the impurity region 24s, and a gate electrode 26g (typically, a polysilicon electrode) connected to the address control line 46 (see FIG. 1). In this example, the signal detection transistor 24 and the address transistor 26 are electrically connected to each other by sharing the impurity region 24s. The impurity region 26s serves as, for example, a source region of the address transistor 26. The impurity region 26s has a connection with a vertical signal line 47 (see FIG. 1) that is not illustrated in FIG. 2. The reset transistor 28 includes the impurity region 28d, the impurity region 28s, and a gate electrode 28g (typically, a polysilicon electrode) connected to the reset control line 48 (see FIG. 1). The impurity region 28s serves as, for example, a source region of the reset transistor 28. The impurity region 28s has a connection to the reset voltage line 44 (see FIG. 1) that is not illustrated in FIG. 2.

On the semiconductor substrate 20, an interlayer insulating layer 50 (typically, a silicon dioxide layer) is disposed to cover the signal detection transistor 24, the address transistor 26, and the reset transistor 28. As illustrated, wiring layers 56 may be disposed in the interlayer insulating layer 50. The wiring layers 56 are typically formed of a metal such as copper, and, for example, may partly include wiring such as the vertical signal line 47 described above. The number of insulating layers in the interlayer insulating layer 50 and the number of the wiring layers 56 disposed in the interlayer insulating layer 50 may be set to any numbers and are not limited to the numbers in the example illustrated in FIG. 2.

On the interlayer insulating layer 50, the photoelectric conversion section 13 described above is disposed. In other words, in an embodiment of the present disclosure, the plurality of unit pixels 10 constituting the pixel array PA (see FIG. 1) are formed on the semiconductor substrate 20. The plurality of unit pixels 10 that are arrayed two-dimensionally on the semiconductor substrate 20 form a photosensitive region (pixel region). The distance between two adjacent unit pixels 10 (pixel pitch) may be, for example, about 2 μm.

The photoelectric conversion section 13 includes the pixel electrode 11, the counter electrode 12, and the photoelectric conversion layer 15 disposed therebetween. In this example, the counter electrode 12 and the photoelectric conversion layer 15 are formed across the plurality of unit pixels 10. On the other hand, the pixel electrode 11 is provided for each of the unit pixels 10 and is spatially isolated from the pixel electrode 11 of another adjacent unit pixel 10 to be electrically isolated from the pixel electrode 11 of the other unit pixel 10.

The counter electrode 12 is typically a transparent electrode formed of a transparent conductive material. The counter electrode 12 is disposed on a surface of the photoelectric conversion layer 15 on which light is incident. Thus, light passing though the counter electrode 12 is incident on the photoelectric conversion layer 15. Note that the light detected by the imaging device 100 is not limited to light within the wavelength range of visible light (e.g., greater than or equal to 380 nm and less than or equal to 780 nm). The transparent material herein indicates a material that transmits at least part of light in a wavelength range to be detected, and does not need to transmit light in the entire wavelength range of visible light. Note that general electromagnetic waves including infrared rays and ultraviolet rays are expressed as "light" herein for convenience. For the counter electrode 12, for example, it is possible to use a transparent conductive oxide (TCO) such as ITO, IZO, AZO, FTO, $SnO_2$, $TiO_2$, or $ZnO_2$.

The photoelectric conversion layer 15 receives incident light and generates hole-electron pairs. The photoelectric conversion layer 15 is typically formed of an organic semiconductor material. Specific examples of the materials for forming the photoelectric conversion layer 15 will be described later. The photoelectric conversion layer 15 typically has a film-like shape.

As described with reference to FIG. 1, the counter electrode 12 has a connection with the sensitivity control line 42 connected to the voltage supply circuit 32. The counter electrode 12 may be formed across the plurality of unit pixels 10. In this manner, it is possible to apply a sensitivity control voltage with a desired value across the plurality of unit pixels 10 at once from the voltage supply circuit 32 through the sensitivity control line 42. It is also possible to form the counter electrode 12 so as to apply the sensitivity control voltage according to the row in the pixel array PA at once. As long as the sensitivity control voltage with a desired value can be applied from the voltage supply circuit 32, the counter electrode 12 may be provided to be isolated for each of the unit pixels 10. Similarly, the photoelectric conversion layer 15 may be provided to be isolated for each of the unit pixels 10.

By controlling the potential of the counter electrode 12 with respect to the potential of the pixel electrode 11, it is possible to collect, in the pixel electrode 11, one of holes and electrons from hole-electron pairs generated in the photoelectric conversion layer 15 through photoelectric conversion. For example, in a case of using holes as signal charge, it is possible to selectively collect holes in the pixel electrode 11 by making the potential of the counter electrode 12 higher than that of the pixel electrode 11. The amount of signal charge collected per unit time varies depending on the potential difference between the pixel electrode 11 and the counter electrode 12. A case of using holes as signal charge will be described below. As a matter of course, electrons may also be used as signal charge.

By an appropriate bias voltage being applied between the counter electrode 12 and the pixel electrode 11, the pixel electrode 11 that faces the counter electrode 12 collects one of positive charge and negative charge generated through photoelectric conversion in the photoelectric conversion layer 15. The pixel electrode 11 is formed of a metal such as aluminum or copper, a metal nitride, a polysilicon that becomes conductive by an impurity being doped thereto, or the like.

The pixel electrode 11 may be a light-blocking electrode. For example, by forming a TaN electrode with a thickness of 100 nm as the pixel electrode 11, a sufficient light-blocking property can be obtained. By forming the pixel electrode 11 as a light-blocking electrode, light that passes through the photoelectric conversion layer 15 can be prevented from being incident on a channel region or an impurity region of a transistor (at least any of the signal detection transistor 24, the address transistor 26, or the reset transistor 28 in this example) formed on the semiconductor substrate 20. A light-blocking film may be formed in the interlayer insulating layer 50 by using the wiring layers 56 described above. Prevention of light, by using such a light-blocking electrode or light-blocking film, from being incident on a channel region of a transistor formed on the semiconductor substrate 20 may prevent shift of transistor characteristics (e.g., variations in threshold voltage), for example. In addition, prevention of light from being incident on an impurity region formed in the semiconductor substrate 20 may prevent noise generated by unintended photoelectric conversion in the impurity region from being mixed. In this manner, prevention of light from being incident on the semiconductor substrate 20 contributes to improvement of reliability of the imaging device 100.

As schematically illustrated in FIG. 2, the pixel electrode 11 is connected to the gate electrode 24g of the signal detection transistor 24 through a plug 52, a wiring 53, and a contact plug 54. In other words, the gate of the signal detection transistor 24 has an electrical connection with the pixel electrode 11. The plug 52 and the wiring 53 can be formed of, for example, a metal such as copper. The plug 52, the wiring 53, and the contact plug 54 form at least part of the charge accumulation section 41 (see FIG. 1) between the signal detection transistor 24 and the photoelectric conversion section 13. The wiring 53 may be part of the wiring layers 56. In addition, the pixel electrode 11 is also connected to the impurity region 28d via the plug 52, the wiring 53, and a contact plug 55. In the structure illustrated in FIG. 2, the gate electrode 24g of the signal detection transistor 24, the plug 52, the wiring 53, the contact plugs 54 and 55, and the impurity region 28d being one of the source region and the drain region of the reset transistor 28 serve as the charge accumulation section 41 that accumulates signal charge collected in the pixel electrode 11.

Since the signal charge is collected in the pixel electrode 11, a voltage in accordance with the amount of the signal charge accumulated in the charge accumulation section 41 is applied to the gate of the signal detection transistor 24. The signal detection transistor 24 amplifies the voltage. The voltage amplified by the signal detection transistor 24 is selectively read as a signal voltage through the address transistor 26.

Operation of Imaging Device

Figure 3:
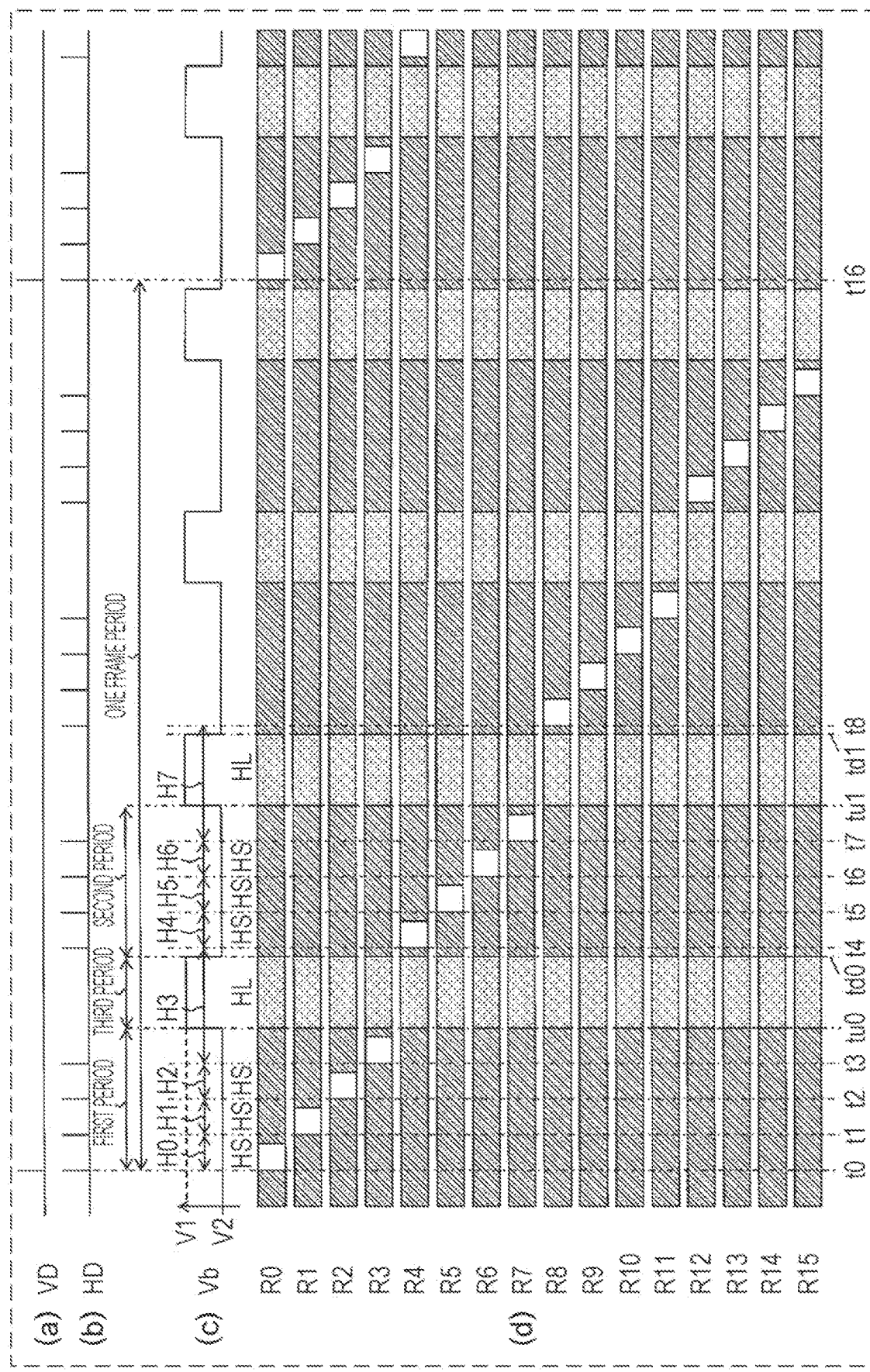
FIG. 3 is a chart for describing the operation of the imaging device.

Referring to FIG. 3, image acquisition using the high-sensitivity exposure period and the low-sensitivity exposure period will be described. FIG. 3 is a timing chart illustrating an example of the operation of the imaging device 100 according to the first embodiment. In FIG. 3, a graph (a) illustrates a timing of fall (or rise) of a vertical synchronization signal VD, a graph (b) illustrates a timing of fall (or rise) of a horizontal synchronization signal HD, a graph (c) illustrates an example of a temporal change of a voltage Vb to be applied from the voltage supply circuit 32 to the counter electrode 12 through the sensitivity control line 42, and a graph (d) schematically illustrates a signal readout period, the high-sensitivity exposure period, and the low-sensitivity exposure period in the respective rows of the pixel array PA. The reference of the voltage Vb is, for example, a ground potential of the imaging device 100. Although not illustrated in FIG. 3, a predetermined voltage Vs is applied from the voltage supply circuit 35 to the shield electrode 17 through the sensitivity control line 45. The voltage Vs is, for example, 0 V.

In the graph (d) in FIG. 3, the signal readout period in each row of the pixel array PA is illustrated in association with a sensitivity. A dot-hatched rectangle schematically represents the high-sensitivity exposure period in each row. A diagonally hatched rectangle schematically represents the low-sensitivity exposure period in each row. A white rectangle schematically represents the signal readout period in each row. In the graph (d), the white rectangle area overlaps with the diagonally hatched rectangle area. That is, in this example, the signal readout period is included in the low-sensitivity exposure period.

Now, an example of the operation of the imaging device 100 will be described. For simplicity, in this operation example, the number of rows of pixels included in the pixel array PA is 16 in total, from Row R0 to Row R15.

To acquire an image, in each of the unit pixels 10 in the pixel array PA, the charge accumulation section 41 is reset, and a pixel signal accumulated therein after reset is read out. In the imaging device 100 according to this embodiment, during a single readout period, the pixel signal is read out, and the charge accumulation section 41 is reset in order to accumulate charge for the following frame period. For example, as illustrated in FIG. 3, on the basis of the vertical synchronization signal VD, signal readout starts for a plurality of pixels that belong to Row R0. Time t0 is one of the start times.

Figure 4:
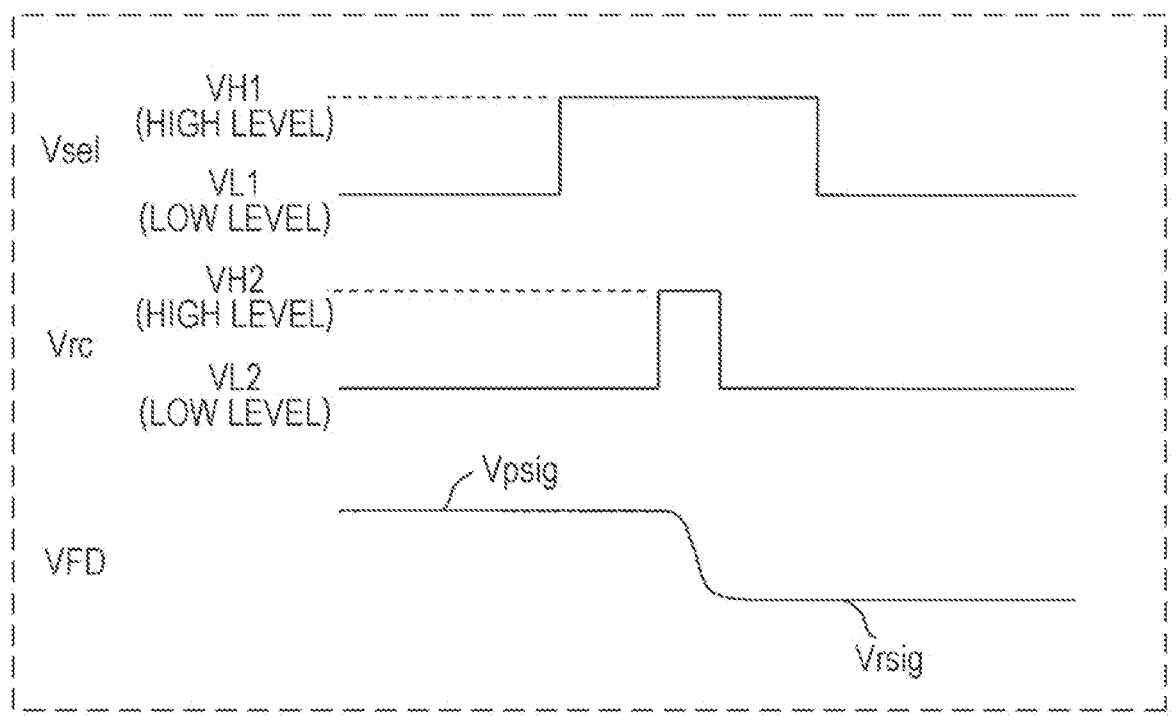
FIG. 4 is a chart for describing control signals during a signal readout period.

As described above, the period represented by a single white rectangle in the graph (d) in FIG. 3 is the signal readout period. FIG. 4 illustrates an example of a timing chart of control signals during the signal readout period. In FIG. 4, a potential Vsel is the potential of the address control line 46 and may change between VL1 being a low level and VH1 being a high level. A potential Vrc is the potential of the reset control line 48 and may change between VL2 being a low level and VH2 being a high level. A potential VFD is the potential of the charge accumulation section 41. The potential VFD is used as a pixel signal Vpsig when charge is accumulated in the charge accumulation section 41 and is used as a reset signal Vrsig when the charge accumulation section 41 is reset.

At time t0, the signal readout period starts. During the signal readout period, first, on the basis of the vertical synchronization signal VD, the potential Vsel of the address control line 46 in Row R0 is switched from the low level to the high level. Thus, each address transistor 26 having the gate connected to the address control line 46 is turned on from the off state. Thus, the potential VFD of the charge accumulation section 41 is output to the corresponding vertical signal line 47. Specifically, the pixel signal Vpsig is output to the vertical signal line 47. The pixel signal Vpsig is a signal corresponding to the amount of charge accumulated in the charge accumulation section 41 during the previous one frame period. The pixel signal Vpsig is transmitted to the column signal processing circuit 37.

In the example in FIG. 3, the signal readout period represented by the white rectangle in the graph (d) includes a reset period in addition to the period for reading out the pixel signal Vpsig. The reset period is a period for resetting the potential of the charge accumulation section 41 of each of the unit pixels 10. Specifically, in this example, after the above pixel readout has ended, the pixels that belong to Row R0 are reset. Between the end of pixel readout and the reset of the pixels that belong to Row R0, for example, AD conversion of the pixel signal may be performed in the column signal processing circuit 37.

The pixels that belong to Row R0 are reset as follows. As illustrated in FIG. 4, the potential Vrc of the reset control line 48 in Row R0 is switched from the low level to the high level. Thus, each reset transistor 28 having the gate connected to the reset control line 48 is turned on from the off state. Thus, the charge accumulation section 41 and the reset voltage line 44 are connected to each other, and the reset voltage Vr is supplied to the charge accumulation section 41. Thus, the potential of the charge accumulation section 41 is reset to the reset voltage Vr. The reset voltage Vr herein is, for example, 0 V.

Subsequently, the potential Vrc of the reset control line 48 is switched from the high level to the low level. Thus, the reset transistor 28 is turned off from the on state. During the off state of the reset transistor 28, the reset signal Vrsig is read out from each of the unit pixels 10 in Row R0 through the corresponding vertical signal line 47. The reset signal Vrsig is a signal corresponding to the value of the reset voltage Vr. The reset signal Vrsig is transmitted to the column signal processing circuit 37.

After reading out the reset signal Vrsig, the potential Vsel of the address control line 46 is switched from the high level to the low level. Thus, the address transistor 26 is turned off from the off state.

As described above, the pixel signal Vpsig and the reset signal Vrsig that are read out are both transmitted to the column signal processing circuit 37. By obtaining the difference between these signals, a fixed pattern noise can be removed. Specifically, the reset signal Vrsig corresponds to a noise component, and by subtracting the noise component from the pixel signal Vpsig, the noise is removed.

In this example, as schematically illustrated in FIG. 3, in accordance with the horizontal synchronization signal HD, signal readout and reset are sequentially performed on pixels that belong to Row R0 to Row R15 in units of row. In the following description, an interval between pulses of the horizontal synchronization signal HD, in other words, a period from selection of a certain row until selection of the next row, may be referred to as "1H period".

In this example, for example, a period H0 from time t0 to time t1 corresponds to a 1H period. A period H1 from time t1 to time t2 also corresponds to a 1H period. A period H2 from time t2 to time t3 also corresponds to a 1H period. A period H3 from time t3 to time t4 also corresponds to a 1H period.

During the period H0, readout from Row R0 is performed. During the period H1, readout from Row R1 is performed. During the period H2, readout from Row R2 is performed. During the period H3, readout from Row R3 and charge accumulation in the charge accumulation section 41 are performed. Note that the expression "readout is performed during a period" is not to be limitedly interpreted as spending the entire period for readout. This expression includes spending part of the period for readout.

In this embodiment, the 1H periods for the period H0, the period H1, and the period H2 have an equal duration HS. In contrast, the period H3 has a duration HL that is longer than the duration HS. For example, the duration HL is greater than or equal to several times as long as the duration HS and less than or equal to several hundreds of times as long as the duration HS.

In the example in FIG. 3, on the basis of the vertical synchronization signal VD, scanning is performed on four rows from Row R0 to Row R3. Specifically, scanning is performed on three rows from Row R0 to Row R2 during the 1H period with the duration HS for each row. Subsequently, scanning is performed on one row of Row R3 during the 1H period with the duration HL. Furthermore, on the basis of the same vertical synchronization signal VD, scanning is also performed on Row R4 to Row R15. The scanning herein refers to readout of signals from pixels that belong to a row.

As illustrated in FIG. 3, readout from the pixels that belong to Row R0 is performed during the period H0 from time t0 to time t1, readout from the pixels that belong to Row R1 is performed during the period H1 from time t1 to time t2, readout from the pixels that belong to Row R2 is performed during the period H2 from time t2 to time t3, and readout from the pixels that belong to Row R3 is performed during a period in the period H3, from time t3 to time tu0. During readout from the pixels that belong to Row R0 to Row R3, a voltage V2 is applied from the voltage supply circuit 32 to the counter electrode 12.

At time tu0, the voltage Vb applied from the voltage supply circuit 32 to the counter electrode 12 is changed from the voltage V2 to a voltage V1. Subsequently, at time td0, the voltage Vb is switched to the voltage V2 again. As illustrated in FIG. 3, time tu0 and time td0 belong to the same period H3. Time tu0 is a time after the signal readout period for the pixels that belong to Row R3 has ended. Time td0 is a time before the signal readout period for the pixels that belong to Row R4 starts.

The voltage V2 is typically a voltage with which the potential difference between the pixel electrode 11 and the counter electrode 12 becomes less than or equal to 0 V. This potential difference will be further described below. As described above, by turning on the reset transistor 28, the reset voltage Vr can be supplied from the reset voltage source 34 to the charge accumulation section 41 through the reset voltage line 44 and the reset transistor 28. By the reset voltage Vr being supplied to the charge accumulation section 41, the voltage of the pixel electrode 11 is also reset to the voltage Vr. By setting the voltage V2 to be equal to the voltage Vr, the above potential difference can be made 0 V when the voltage of the pixel electrode 11 is reset to the voltage Vr. As described above, the voltage Vr may be 0 V.

In a state where the bias voltage applied to the photoelectric conversion layer 15 is 0 V, most of charge generated in the photoelectric conversion layer 15 is eliminated. This is assumed to be because most of positive and negative charge generated by light irradiation may immediately be eliminated due to recombination. On the other hand, signal charge accumulated in the charge accumulation section 41 during high-sensitivity exposure is not eliminated and is held until a reset operation of the pixel is performed. The signal charge is not discarded by switching between the low-sensitivity exposure state and the high-sensitivity exposure state. As a result, even if the high-sensitivity exposure period and the low-sensitivity exposure period are repeated, the signal charge accumulated during each high-sensitivity exposure is integrated. During the high-sensitivity exposure, in the above example, the bias voltage is 10 V. Note that when a positive bias voltage is applied to the photoelectric conversion layer 15 during the low-sensitivity exposure, signal charge is accumulated also during the low-sensitivity exposure. In such a case, signal charge accumulated during the low-sensitivity exposure, in addition to the high-sensitivity exposure, is integrated.

Readout from the pixels that belong to Row R4 to Row R7 is performed in substantially the same manner as readout from the pixels that belong to Row R0 to Row R3. Specifically, as illustrated in FIG. 3, readout from the pixels that belong to Row R4 is performed during a period H4 from time t4 to time t5, readout from the pixels that belong to Row R5 is performed during a period H5 from time t5 to time t6, readout from the pixels that belong to Row R6 is performed during a period H6 from time t6 to time t7, and readout from the pixels that belong to Row R7 is performed during a period in a period H7, from time t7 to time tu1. During readout from the pixels that belong to Row R4 to Row R7, the voltage V2 is applied from the voltage supply circuit 32 to the counter electrode 12. Each of the periods H4, H5, and H6 is a 1H period with the duration HS. The period H7 is a 1H period with the duration HL.

At time tu1, the voltage Vb applied from the voltage supply circuit 32 to the counter electrode 12 is changed from the voltage V2 to the voltage V1. Subsequently, at time td1, the voltage Vb is switched to the voltage V2 again. As illustrated in FIG. 3, time tu1 and time td1 belong to the same period H7. Time tu1 is a time after the signal readout period for the pixels that belong to Row R7 has ended. Time td1 is a time before the signal readout period for the pixels that belong to Row R8 starts.

Readout from the pixels that belong to Row R8 to Row R11 is performed in substantially the same manner as readout from the pixels that belong to Row R0 to Row R3. Readout from the pixels that belong to Row R12 to Row R15 is performed in substantially the same manner as readout from the pixels that belong to Row R0 to Row R3.

In the above manner, in the example in FIG. 3, the voltage Vb to be applied to the counter electrode 12 is switched between the voltage V2 and the voltage V1 in a cycle of a four-rows scanning period. The four-rows scanning period corresponds to the sum of three durations HS and one duration HL. From time t0 to time t16, four cycles each corresponding to the four-rows scanning period appear.

The high-sensitivity exposure period starts by the voltage supply circuit 32 switching the voltage to be applied to the counter electrode 12 to the voltage V1 that is higher than the voltage V2. The low-sensitivity exposure period starts by the voltage supply circuit 32 switching the voltage to be applied to the counter electrode 12 to the voltage V2.

Specifically, while signal readout from the pixels that belong to Row R0 to Row R3 is being performed, the voltage supply circuit 32 maintains the voltage Vb to be applied to the counter electrode 12 at the low voltage V2. Thus, the low-sensitivity exposure state is maintained. After readout from the pixels that belong to Row R3 has ended, the voltage supply circuit 32 switches the voltage Vb from the low voltage V2 to the high voltage V1. Thus, the exposure state is switched from the low-sensitivity exposure state to the high-sensitivity exposure state. The state in which the voltage Vb is the voltage V1 is maintained for a predetermined period. Subsequently, the voltage supply circuit 32 switches the voltage Vb from the voltage V1 to the voltage V2 again.

More specifically, as described above, the 1H period for scanning Row R3 is longer than each of the 1H periods for scanning Row R0 to Row R2. During the long 1H period, readout from the pixels that belong to Row R3 is performed, the voltage Vb is switched from the voltage V2 to the voltage V1, and the voltage Vb is switched from the voltage V1 to the voltage V2.

For Row R4 to Row R7, in substantially the same manner for Row R0 to Row R3, pixel signal readout is performed, and the voltage Vb is switched. The same applies for Row R8 to Row R11. The same applies for Row R12 to Row R15.

In this manner, pixel signal readout is performed, and the voltage Vb is switched in units of four rows.

The technique of this embodiment can be expressed as follows. The imaging device 100 includes the pixel array PA. A first period, a third period, and a second period appear in this order in one frame. During the first period, pixel signal readout is performed on at least one first row in the pixel array PA. During the second period, pixel signal readout is performed on at least one second row in the pixel array PA. The at least one first row and/or the at least one second row includes two rows in the pixel array PA. During the third period, no pixel signal readout is performed on the rows in the pixel array PA. Each of the first period and the second period is one of the high-sensitivity exposure period and the low-sensitivity exposure period. The third period is the other of the high-sensitivity exposure period and the low-sensitivity exposure period. Note that the at least one first row and the at least one second row do not overlap with each other. In the example in FIG. 3, the duration of the one frame is the same as the duration from the start of pixel signal readout in a row until the start of the following pixel signal readout. Specifically, in the example in FIG. 3, the duration of the one frame is the duration of the period from time t0 to time t16. In this example, the driving section sets the first period, the second period, and the third period and sets the timing for pixel signal readout.

Specifically, in the example in FIG. 3, the period from time t0 to time tu0 may correspond to the first period, the period from time tu0 to time td0 may correspond to the third period, and the period from time td0 to time tu1 may correspond to the second period. The combination of Row R0, Row R1, Row R2, and Row R3 may correspond to the at least one first row. The combination of Row R4, Row R5, Row R6, and Row R7 may correspond to the at least one second row. Each of the first period and the second period is the low-sensitivity exposure period, and the third period is the high-sensitivity exposure period. The first period and the third period are adjacent to each other. The third period and the second period are adjacent to each other.

From a different perspective, in the example in FIG. 3, the period from td0 to time tu1 may correspond to the first period. This period is the low-sensitivity exposure period. The high-sensitivity exposure period subsequent to the first period may correspond to the third period. The low-sensitivity exposure period subsequent to the third period may correspond to the second period. The combination of Row R4, Row R5, Row R6, and Row R7 may correspond to the at least one first row. The combination of Row R8, Row R9, Row R10, and Row R11 may correspond to the at least one second row. Such different perspectives may be similarly possible in the other embodiments.

The technique of this embodiment is suitable for obtaining an appropriate image while maintaining the frame rate. Now, this point will be described.

The upper part in each of FIGS. 5 to 9 illustrates a temporal change of the voltage Vb to be applied to the counter electrode 12. Each rectangle in the lower part represents pixel signal readout.

Figure 5:
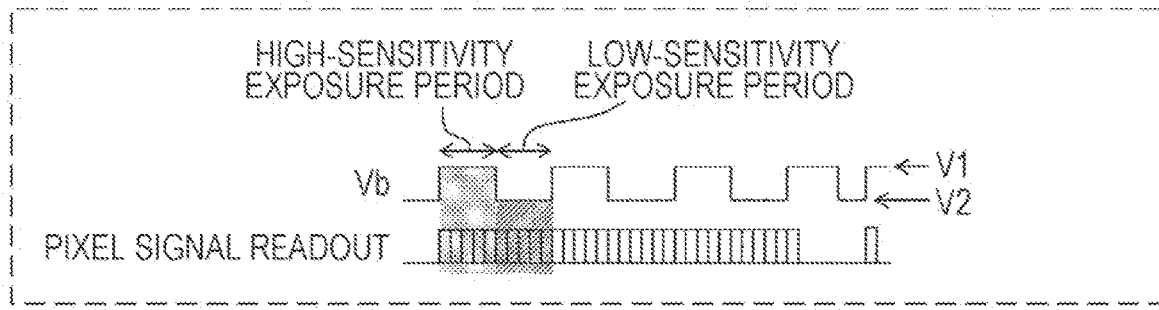
FIG. 5 illustrates a relationship between a voltage of a counter electrode and pixel signal readout.

In the example in FIG. 5, as in this embodiment, no pixel signal readout is performed in the rows in the pixel array PA during a period across the low-sensitivity exposure period and the high-sensitivity exposure period. As will be described in Reference Embodiment later, this is advantageous in terms of obtaining an appropriate image.

However, according to the present inventors' study, there is room for improvement in obtaining an appropriate image. Specifically, in the example in FIG. 5, pixel signal readout is performed during both the low-sensitivity exposure period and the high-sensitivity exposure period. In this case, an output level difference may be generated between a row in the pixel array PA in which pixel signal readout is performed during the low-sensitivity exposure period and a row in the pixel array PA in which pixel signal readout is performed during the high-sensitivity exposure period. In addition, the output level difference may generate a periodic lateral stripe in the images.

Figure 6:
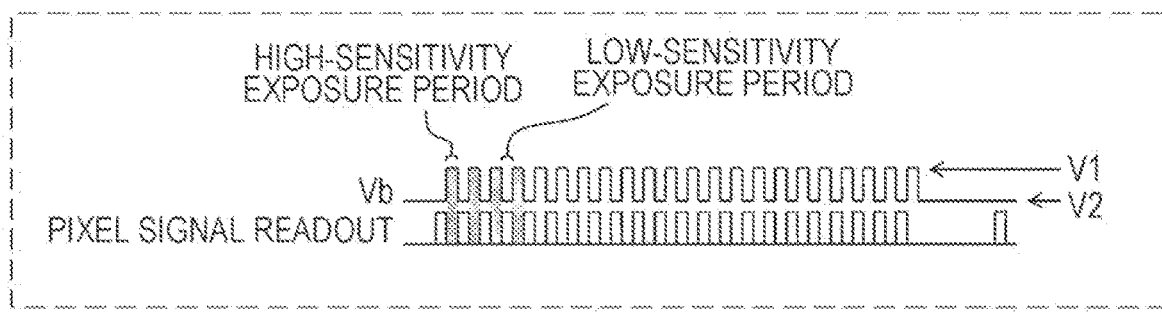
FIG. 6 illustrates a relationship between the voltage of the counter electrode and pixel signal readout.

In the example in FIG. 6, no pixel signal readout is performed during the high-sensitivity exposure period. On the other hand, pixel signal readout is performed during the low-sensitivity exposure period. This may prevent the periodic lateral stripe from being generated, and an appropriate image is likely to be obtained.

The present inventors also considered how the frame rate is maintained. In the example in FIG. 6, in order to maintain the frame rate, each high-sensitivity exposure period may be shortened. However, in this case, an appropriate image may not be obtained for the following reasons.

Figure 8:
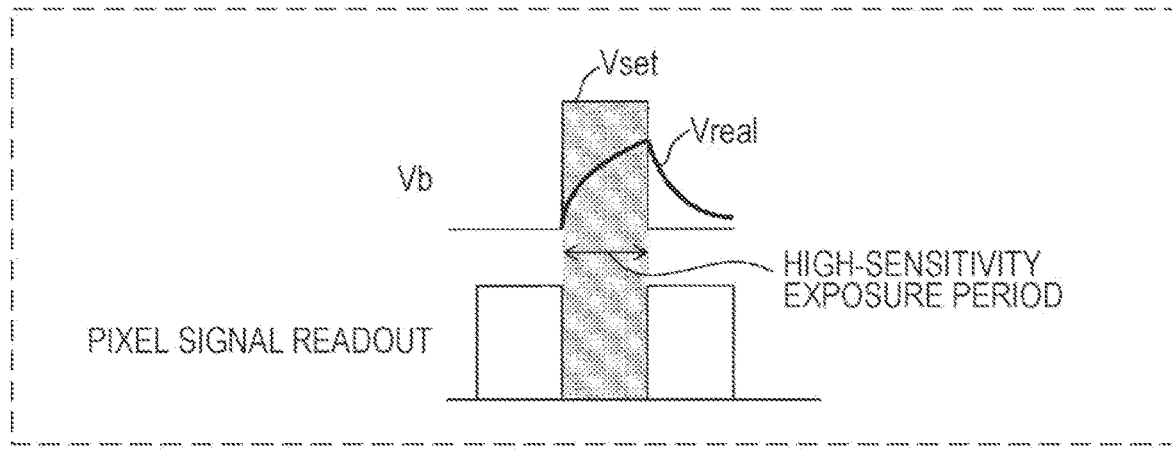
FIG. 8 illustrates a relationship between the voltage of the counter electrode and pixel signal readout.

As illustrated in FIG. 8, it is assumed that the voltage supply circuit 32 changes the voltage Vb of the counter electrode 12 in the form of a pulse as in a voltage Vset. Even if the voltage supply circuit 32 is made to operate in this manner, in reality, the voltage Vb does not change sharply due to delay caused by a resistance-capacitance (RC) time constant. A voltage Vreal in FIG. 8 illustrates the voltage Vb in reality. In FIG. 8, the high-sensitivity exposure period ends before the level of the voltage Vreal becomes sufficiently close to the level of the voltage Vset. In this case, an appropriate image may not be obtained due to an insufficient sensitivity.

The problem with the RC time constant may arise also in a case where pixel signal readout is performed during the high-sensitivity exposure period instead of the low-sensitivity exposure period, and the low-sensitivity exposure period is shortened. Specifically, the low-sensitivity exposure period may end before the level of the voltage Vreal becomes sufficiently low during the low-sensitivity exposure period. In this case, an appropriate image may not be obtained due to an excessively high sensitivity.

Figure 7:
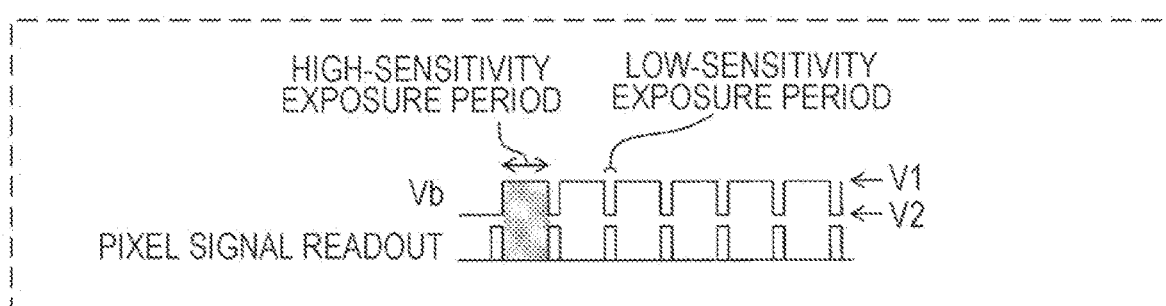
FIG. 7 illustrates a relationship between the voltage of the counter electrode and pixel signal readout.
Figure 9:
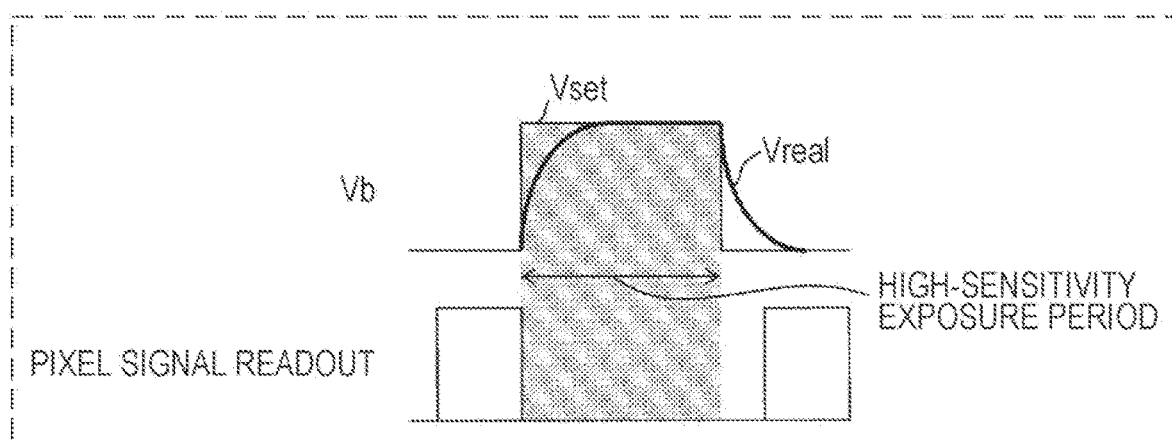
FIG. 9 illustrates a relationship between the voltage of the counter electrode and pixel signal readout.

The problem of the insufficient sensitivity described with reference to FIG. 8 seems to be solved by increasing the duration of the high-sensitivity exposure period as illustrated in FIGS. 7 and 9. However, in FIGS. 7 and 9, since the duration of the high-sensitivity exposure period is long, the interval between the high-sensitivity exposure period and an adjacent low-sensitivity exposure period is long, and furthermore, readout is performed on only one row per single low-sensitivity exposure period. Thus, it is difficult to maintain the frame rate.

On the other hand, with the technique of this embodiment, pixel signal readout is performed during the first period and the second period, and no pixel signal readout is performed during the third period. This may prevent the periodic lateral stripe from being generated, and an appropriate image is likely to be obtained. Furthermore, at least one of the at least one first row or the at least one second row includes two rows in the pixel array PA. This, the frame rate is likely to be maintained. From the above reasons, the technique of this embodiment is suitable for obtaining an appropriate image while maintaining the frame rate.

In the example in FIG. 3, both the at least one first row and the at least one second row include two rows in the pixel array PA. This is advantageous in terms of maintaining the frame rate. Note that the two rows included in the at least one first row and the two rows included in the at least one second row do not overlap with each other.

In a case where the at least one first row includes two rows in the pixel array PA, the two rows are typically, but not limited to, adjacent to each other. If the at least one first row includes a plurality of rows, all of the plurality of rows may be, but not limited to, successively arranged without any other rows.

In a case where the at least one second row includes two rows in the pixel array PA, the two rows are typically, but not limited to, adjacent to each other. If the at least one second row includes a plurality of rows, all of the plurality of rows may be, but not limited to, successively arranged without any other rows.

The at least one first row and the at least one second row may be or may not be adjacent to each other.

As described above, in this embodiment, the first period, the third period, and the second period appear in this order in one frame. If the first period or the second period is defined as an X-th period, the X-th period and the third period may be repeated alternately in one frame. The one frame may be constituted by this repetition alone.

If the at least one first row includes a plurality of rows, the number thereof may be, for example, greater than or equal to 10 and less than or equal to 1000, and specifically, greater than or equal to 30 and less than or equal to 300. If the at least one second row includes a plurality of rows, the number thereof may be, for example, greater than or equal to 10 and less than or equal to 1000, and specifically, greater than or equal to 30 and less than or equal to 300.

As understood from the description above, according to this embodiment, a plurality of high-sensitivity exposure periods are dispersed in one frame. Pieces of data obtained through image capturing during the respective high-sensitivity exposure periods are superposed to form an image. In this manner, the high-sensitivity exposure periods are unlikely to be concentrated at a specific area in one frame period, and information over the entire frame period is likely to be obtained. Thus, compared with a case in which the high-sensitivity exposure periods are concentrated at one area in one frame, it is likely to capture an appropriate image of a subject that changes over time. For example, it is likely to capture an appropriate image of a blinking subject such as a light emitting diode (LED). Specifically, if the high-sensitivity exposure periods are concentrated at one area, the subject may not emit light within the high-sensitivity exposure periods. In contrast, if the plurality of high-sensitivity exposure periods are dispersed, such a situation is unlikely to occur, and it is easy to capture an image of the blinking subject.

In the example in FIG. 3, the number of rows constituting the at least one first row is equal to the number of rows constituting the at least one second row. This is advantageous in terms of capturing an appropriate image of a subject that changes over time. Specifically, timings for pixel signal readout are likely to be evenly dispersed. Thus, the first period and the second period are likely to have even durations. This helps the high-sensitivity exposure periods to be evenly dispersed. This is advantageous in terms of capturing an appropriate image of a subject that changes over time for the above reasons. Note that in the example in FIG. 3, specifically, the number of rows constituting the at least one first row is 4, and the number of rows constituting the at least one second row is 4.

Figure 10:
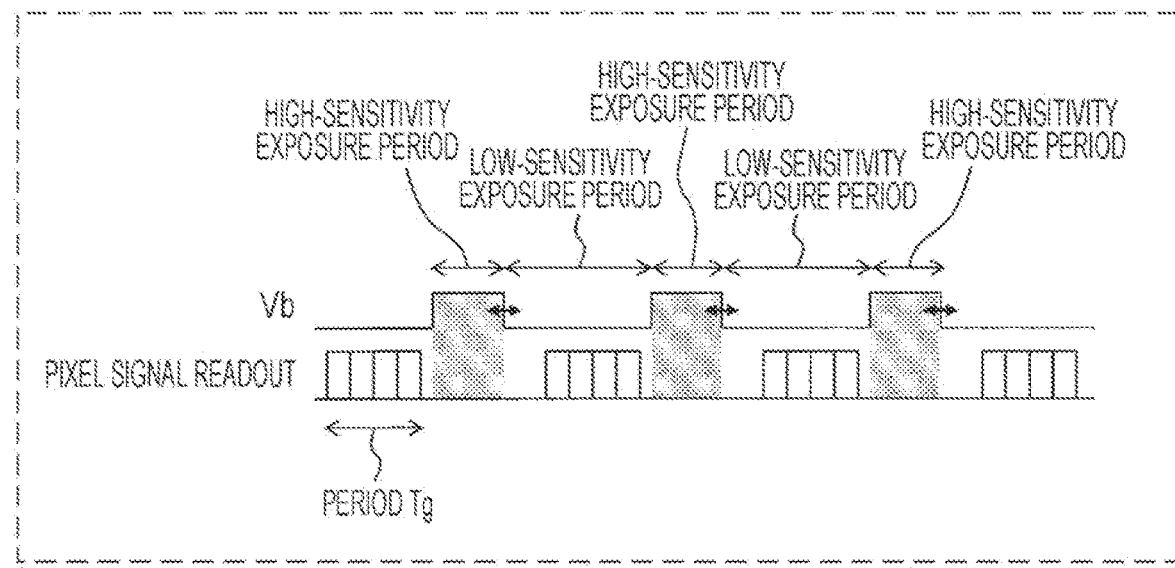
FIG. 10 illustrates a relationship between the voltage of the counter electrode and pixel signal readout.
Figure 11:
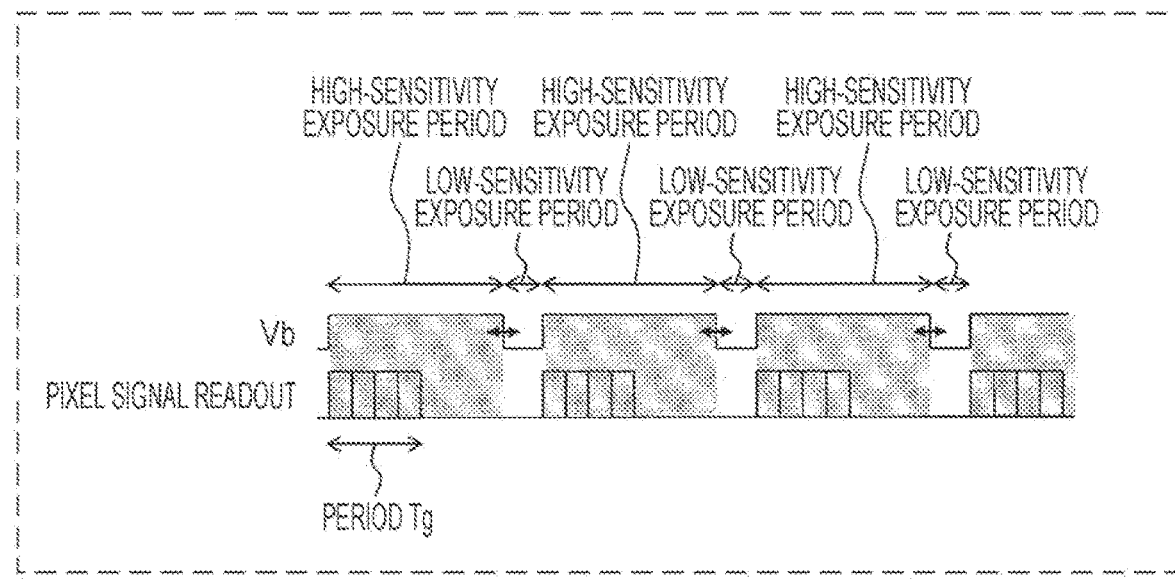
FIG. 11 illustrates a relationship between the voltage of the counter electrode and pixel signal readout.

In the example in FIG. 3, each of the first period and the second period is the low-sensitivity exposure period, and the third period is the high-sensitivity exposure period. Setting these periods in this manner is suitable for image capturing with a low sensitivity. This point will be described with reference to FIGS. 10 and 11. In FIGS. 10 and 11, a period constituted by groups of timings for pixel signal readout (four groups in the example in FIGS. 10 and 11) is set as a period Tg. In FIG. 11, the first period, the second period, and the third period are set in a manner opposite to the above. In this case, if a long low-sensitivity exposure period and a short high-sensitivity exposure period are employed in order to make a sensitivity low, the period Tg is likely to stick out from the high-sensitivity exposure period. This is disadvantageous in terms of capturing an appropriate image. On the other hand, in FIG. 10, as in FIG. 3, each of the first period and the second period is the low-sensitivity exposure period, and the third period is the high-sensitivity exposure period. In this case, if a long low-sensitivity exposure period and a short high-sensitivity exposure period are employed in order to make a sensitivity low, the period Tg is unlikely to stick out from the low-sensitivity exposure period. From the above, if each timing for pixel signal readout is fixed (i.e., if the frame rate is fixed), it is understood that image degradation due to the above stick-out is likely to be prevented while maintaining a low sensitivity in the example in FIG. 10 compared with the example in FIG. 11.

The present disclosure does not exclude an embodiment of changing the timings for pixel signal readout. It is possible to make the interval between the timings for pixel signal readout longer. In this case, even if each of the first period and the second period is set as the high-sensitivity exposure period and the third period is set as the low-sensitivity exposure period as in FIG. 11, a low sensitivity can be obtained without the above stick-out. Specifically, by employing a long interval and fitting the long low-sensitivity exposure period within the long interval, a low sensitivity can be obtained without the above stick-out. However, if the interval is made longer, it is difficult to maintain the frame rate. Thus, even if the embodiment of changing timings for pixel signal readout is taken into account, the example in FIG. 10 is advantageous over the example in FIG. 11 in obtaining a low sensitivity.

In one frame, the total period of the high-sensitivity exposure period may be shorter than the total period of the low-sensitivity exposure period. This helps image capturing with a low sensitivity. Note that this feature is also applicable to the other embodiments.

The imaging device 100 may include a control mode for rolling shutter operation. The rolling shutter is a method for sequential pixel signal readout for each row in the pixel array PA. In addition, by rolling shutter, the high-sensitivity exposure period is sequentially set for each row in the pixel array PA. The "one frame" in FIG. 3 may be a frame in which the imaging device 100 operates by rolling shutter. The same applies to the other figures.

In the example in FIGS. 1 and 2, the imaging device 100 includes the semiconductor substrate 20 and the photoelectric conversion section 13. The photoelectric conversion section 13 includes the photoelectric conversion layer 15, the pixel electrode (hereinafter also referred to as first electrode) 11, and the counter electrode (hereinafter also referred to as second electrode) 12. The semiconductor substrate 20, the first electrode 11, the photoelectric conversion layer 15, and the second electrode 12 are stacked in this order. Such a stack structure may form an imaging element with an easily adjustable sensitivity. The first electrode 11 corresponds to the pixel electrode 11. The second electrode 12 corresponds to the counter electrode 12. Specifically, each of the first electrode 11 and the second electrode 12 is in contact with the photoelectric conversion layer 15.

In the example in FIGS. 1 and 2, the imaging device 100 includes the voltage supply circuit 32. During the high-sensitivity exposure period, the voltage supply circuit 32 controls the voltage Vb of the second electrode 12 to a first voltage. During the low-sensitivity exposure period, the voltage supply circuit 32 controls the voltage Vb of the second electrode 12 to a second voltage. The first voltage and the second voltage are different from each other. By controlling the voltage of the second electrode 12 in this manner, the sensitivity can be adjusted. The expression "to control the voltage of an electrode to the first voltage" or "to control the voltage of an electrode to the second voltage" indicates that a target voltage is the first voltage or the second voltage. This expression is not to be limitedly interpreted as the voltage Vb of the second electrode 12 reaching the first voltage or the second voltage instantly. This expression includes the voltage Vb of the second electrode 12 reaching the first voltage or the second voltage relatively slowly by being influenced by the time constant or the like. The same applies to the following expression "to control the voltage of an electrode to a third voltage" or "to control the voltage of an electrode to a fourth voltage". In the example in FIGS. 1 to 3, the first voltage corresponds to the voltage V1, and the second voltage corresponds to the voltage V2.

In the example in FIGS. 1 and 2, the imaging device 100 collects holes in the pixel electrode 11. Thus, the first voltage is higher than the second voltage. However, as described above, the imaging device 100 may also collect, instead of holes, electrons in the pixel electrode 11. In this case, the first voltage may be lower than the second voltage.

The imaging device 100 may have an R component and a C component that may change the voltage of the second electrode 12 in accordance with the time constant determined by the R component and the C component from the start of the third period. The third period is, for example, longer than or equal to twice the time constant. In this manner, during the third period, even if the presence of the time constant is taken into account, the voltage of the second electrode 12 may be sufficiently close to an expected value. This is advantageous in terms of obtaining a desired sensitivity. The third period may be longer than or equal to three times the time constant. For example, the third period is longer than or equal to 20 µs. The third period is, for example, shorter than or equal to thirty times the time constant. For example, the third period is shorter than or equal to 300 µs. The R component is a resistance component. The C component is a capacitance component.

Similarly, the voltage of the second electrode 12 changes in accordance with the time constant from the start of the first period. The first period may be longer than or equal to twice or longer than or equal to three times the time constant. The first period may be longer than or equal to 20 µs. The first period may be shorter than or equal to thirty times the time constant. The first period may be shorter than or equal to 300 µs.

Similarly, the voltage of the second electrode 12 changes in accordance with the time constant from the start of the second period. The second period may be longer than or equal to twice or longer than or equal to three times the time constant. The second period may be longer than or equal to 20 µs. The second period may be shorter than or equal to thirty times the time constant. The second period may be shorter than or equal to 300 µs.

The above R component may include a resistance of the second electrode 12. Specifically, the above R component may include the resistance of the second electrode 12 and a resistance of the photoelectric conversion layer 15. More specifically, when a voltage supply source for the second electrode 12 is defined as a power source PS, a voltage output section in the power source PS for the second electrode 12 is defined as a first end, and the boundary between the photoelectric conversion layer 15 and the first electrode 11 is defined as a second end, the above R component may be a composite resistance of elements that constitute an electrical path from the first end to the second end. Note that the R component including a resistance R1 of an element is a concept including a case in which the R component is the resistance R1. In addition, the R component including the resistance R1 of an element is a concept including general cases in which the R component is a composite resistance of a plurality of resistances, such as a case in which the element having the resistance R1 is connected in series to another element having a resistance R2 and the R component is R1+R2, and a case in which this element is connected in parallel to another element having the resistance R2 and the R component is R1R2/(R1+R2).

The above C component may include a capacitance of the photoelectric conversion layer 15. Specifically, the above C component may include a capacitance of the second electrode 12 and the capacitance of the photoelectric conversion layer 15. More specifically, when the voltage supply source for the second electrode 12 is defined as the power source PS, the voltage output section in the power source PS for the second electrode 12 is defined as the first end, and the boundary between the photoelectric conversion layer 15 and the first electrode 11 is defined as the second end, the above C component may be a composite capacitance of elements that constitute an electrical path from the first end to the second end. Note that the C component including a capacitance C1 of an element is a concept including a case in which the C component is the capacitance C1. In addition, the C component including the capacitance C1 of an element is a concept including general cases in which the C component is a composite capacitance of a plurality of capacitances, such as a case in which the element having the capacitance C1 is connected in parallel to another element having a capacitance C2 and the C component is C1+C2, and a case in which this element is connected in series to another element having the capacitance C2 and the C component is C1C2/(C1+C2).

As described above, in this embodiment, during the first period, pixel signal readout is performed on the at least one first row in the pixel array PA. During the second period, pixel signal readout is performed on the at least one second row in the pixel array PA. At least one of the at least one first row or the at least one second row includes two rows in the pixel array PA. During the third period, no pixel signal readout is performed on the rows in the pixel array PA. Each of the first period and the second period is one of the high-sensitivity exposure period and the low-sensitivity exposure period, and the third period is the other of the high-sensitivity exposure period and the low-sensitivity exposure period. A duty ratio may be changed so as to maintain this configuration. The duty ratio may be changed so as to maintain, in addition to this configuration, other features of this embodiment. The duty ratio herein refers to a ratio of the total period of the high-sensitivity exposure period in one frame to the one frame period. Changing the duty ratio can adjust the sensitivity.

Specifically, by changing the duty ratio, electronic neutral density (ND) control is performed. The electronic ND control refers to electric control on the sensitivity of an imaging element. The electronic ND control may also be performed by adjusting the value of the potential difference between the pixel electrode 11 and the counter electrode 12 during the high-sensitivity exposure period. Now, these two types of electronic ND control will be described.

First, electronic ND control by adjusting the value of the potential difference between the pixel electrode 11 and the counter electrode 12 will be described.

As understood from the description above, according to this embodiment, the potential of the counter electrode 12 with respect to the potential of the pixel electrode 11 can be controlled. Thus, from hole-electron pairs generated in the photoelectric conversion layer 15 through photoelectric conversion, one of holes and electrons can be collected in the pixel electrode 11. The amount of signal charge collected per unit time changes depending on the potential difference between the pixel electrode 11 and the counter electrode 12. By changing the potential difference, electronic ND control can be performed.

Figure 12:
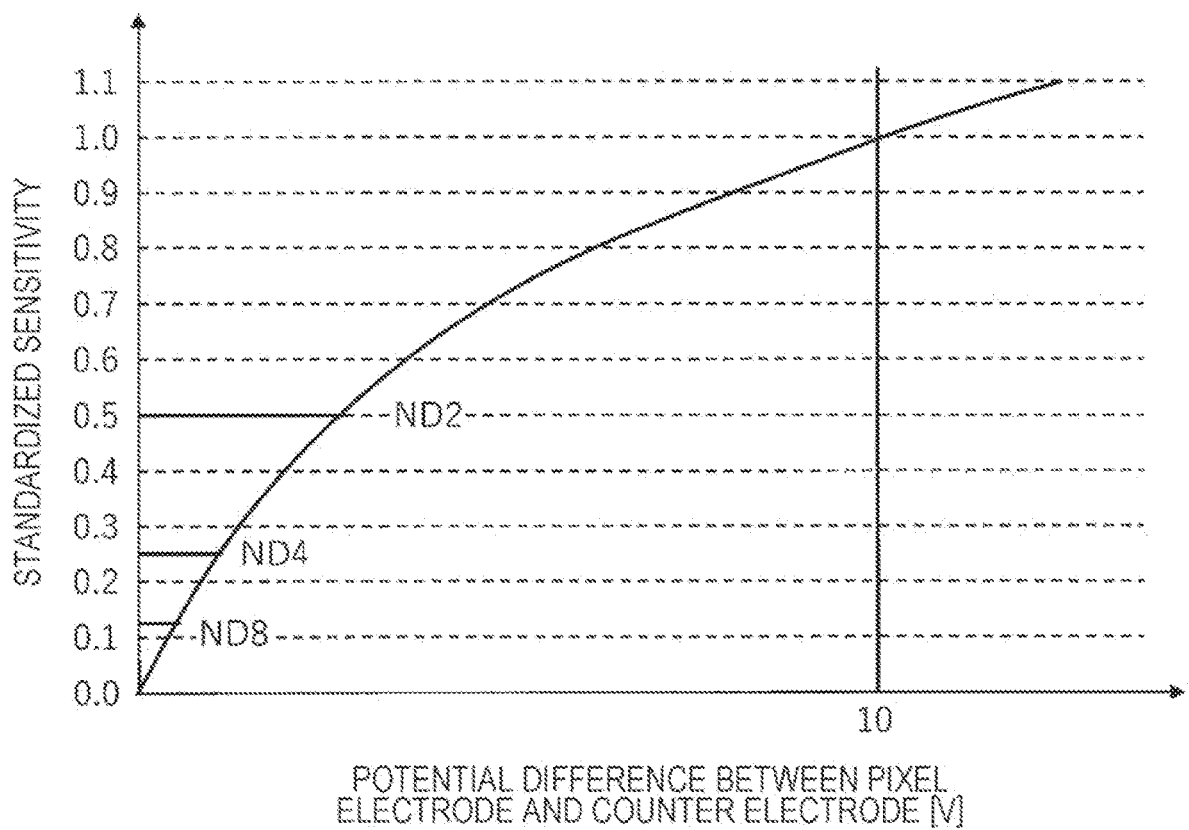
FIG. 12 illustrates a relationship between a potential difference between a pixel electrode and the counter electrode and a standardized sensitivity.

FIG. 12 illustrates an example of change in the light-receiving sensitivity of the photoelectric conversion layer 15 with respect to the potential difference between the pixel electrode 11 and the counter electrode 12. In FIG. 12, the horizontal axis indicates the potential difference between the pixel electrode 11 and the counter electrode 12, and the vertical axis indicates a standardized sensitivity of the photoelectric conversion layer 15. The standardized sensitivity herein is a standardized value when the sensitivity obtained with the potential difference between the pixel electrode 11 and the counter electrode 12 being 10 V is 1.0.

FIG. 12 illustrates that the light-receiving sensitivity of the photoelectric conversion layer 15 can be adjusted by adjusting the potential difference between the pixel electrode 11 and the counter electrode 12. Specifically, in FIG. 12, "ND2" indicates a standardized sensitivity corresponding to an ND2 filter that reduces the amount of light incident on an imaging element by half, "ND4" indicates a standardized sensitivity corresponding to an ND4 filter that reduces the amount of light incident on an imaging element to a quarter, and "ND8" indicates a standardized sensitivity corresponding to an ND8 filter that reduces the amount of light incident on an imaging element to one eighth. The standardized sensitivity corresponding to the ND2 filter is a half of 1.0, which is 0.5. The standardized sensitivity corresponding to the ND4 filter is a quarter of 1.0, which is 0.25. The standardized sensitivity corresponding to the ND8 filter is one eighth of 1.0, which is 0.125. These standardized sensitivities can be adjusted by adjusting the potential difference between the pixel electrode 11 and the counter electrode 12 and adjusting an electric field applied to the photoelectric conversion layer 15.

In the above manner, the potential difference corresponding to the light-receiving sensitivity corresponding to a desired ND function can be given between the pixel electrode 11 and the counter electrode 12. Thus, the photoelectric conversion layer 15 can serve as an electronic ND filter, and electronic ND control can be performed.

Figure 13:
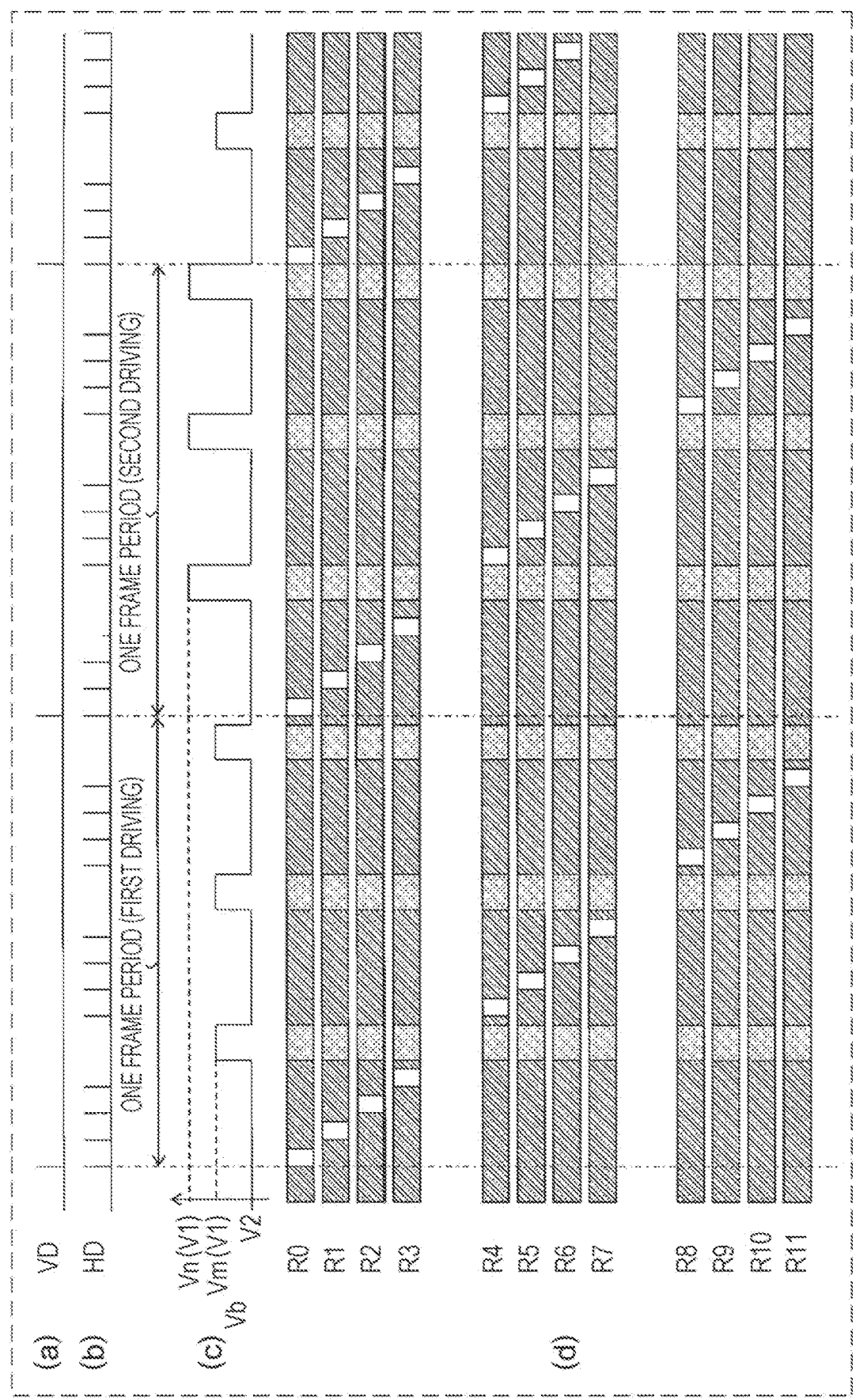
FIG. 13 is a chart for describing the operation of the imaging device.

FIG. 13 illustrates the example of electronic ND control by adjusting the value of the potential difference between the pixel electrode 11 and the counter electrode 12. In the example in FIG. 13, the imaging device 100 controls the voltage Vb of the second electrode 12 to the voltage V1, which is the first voltage, during the high-sensitivity exposure period. The imaging device 100 performs first driving using a first driving voltage Vm as the voltage V1, which is the first voltage, and second driving using a second driving voltage Vn as the voltage V1, which is the first voltage. The first driving voltage Vm and the second driving voltage Vn are different from each other. The example in FIG. 13 can be implemented by the above-described stack structure.

Next, electronic ND control by changing the duty ratio will be described.

The potential difference between the pixel electrode 11 and the counter electrode 12 may be selected from two values: a relatively large first value and a relatively small second value. If the potential difference is selected in this manner, even if the first value and the second value are fixed, the sensitivity can be adjusted. By changing a ratio of the period of the first value to the sum of the period of the first value and the period of the second value, the sensitivity can be adjusted.

The first value may be, but not limited to, the potential difference by which the standardized sensitivity of the photoelectric conversion layer 15 becomes 1.0. This potential difference is 10 V in the above example. The second value may be the potential difference by which the standardized sensitivity of the photoelectric conversion layer 15 becomes 0.0. This potential difference is 0 V in the above example.

In the example in FIG. 12, the light-receiving sensitivity of the photoelectric conversion layer 15 changes non-linearly with respect to the potential difference between the pixel electrode 11 and the counter electrode 12. Even in such a case, with the electronic ND control by changing the duty ratio, the light-receiving sensitivity with respect to the duty ratio can change linearly. Thus, the sensitivity can be adjusted easily. However, also in such a case, the electronic ND control by adjusting the value of the potential difference between the pixel electrode 11 and the counter electrode 12 can be performed. For example, this control can be performed by using a storage that stores a function indicating the relation between the potential difference and the light-receiving sensitivity.

In the example in FIG. 3, the duty ratio is $(td1-tu1)/(3\times HS+HL)$. With this duty ratio, the image capturing sensitivity decreases to $(td1-tu1)/(3\times HS+HL)$ times, compared with a case in which the duty ratio is 1. In the example in FIG. 3, the effect of electronic ND for reducing the sensitivity by this multiplying factor is obtained.

In the example in FIG. 3, it is possible to adjust a time range for setting the voltage Vb to be applied to the counter electrode 12 to the voltage V1. Specifically, the time range from time tu0 to time td0 can be adjusted. By such adjustment, the exposure time can be adjusted, and the light-receiving sensitivity can be adjusted.

Example of Eight-Rows Cycle

In the example in FIG. 3, the voltage Vb to be applied to the counter electrode 12 is switched between the voltage V2 and the voltage V1 in a cycle of a four-rows scanning period. Any other cycle may be employed. Now, with reference to FIG. 14, an example of switching the voltage Vb in a cycle of an eight-rows scanning period will be described.

Figure 14:
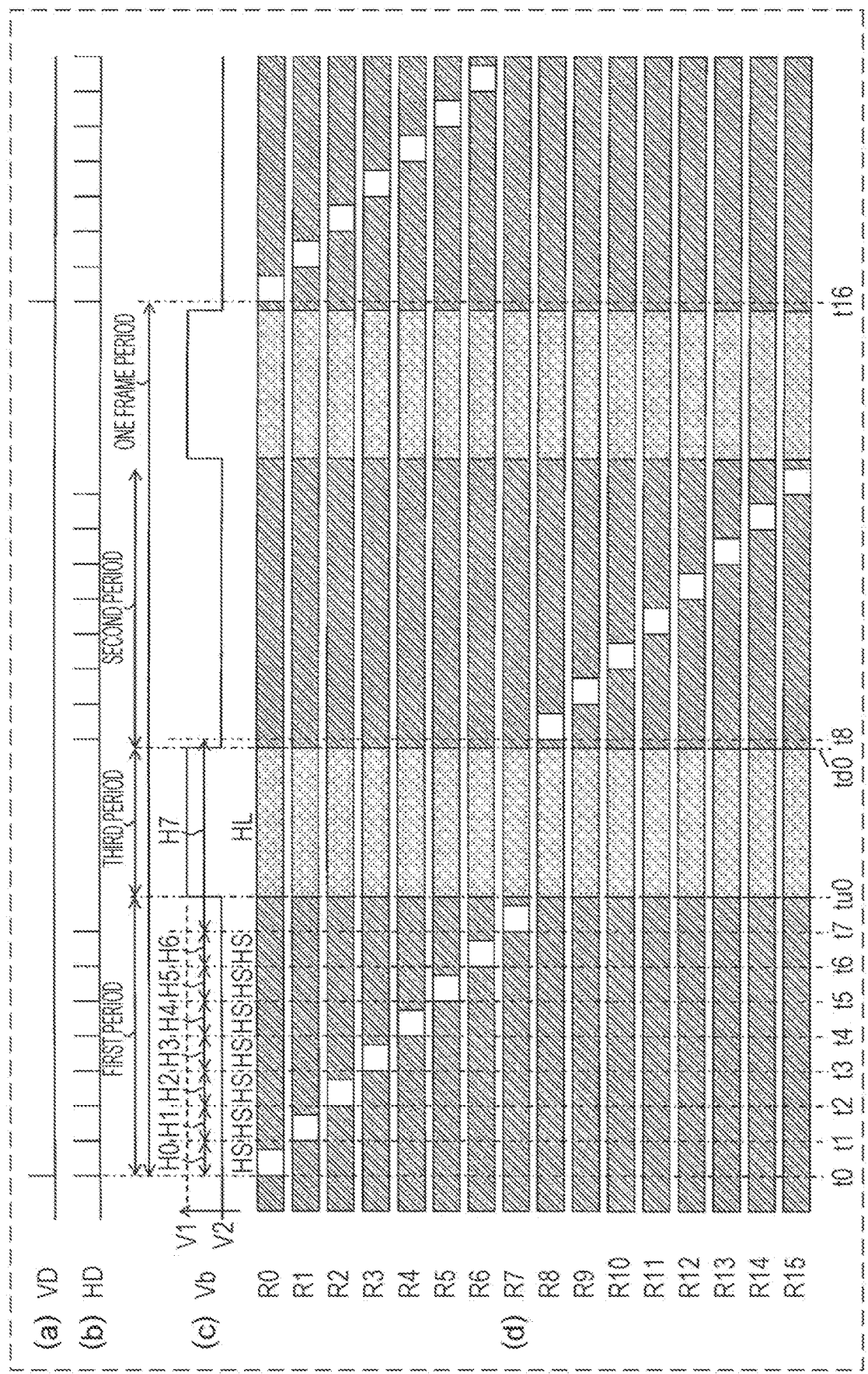
FIG. 14 is a chart for describing the operation of the imaging device.

In the example in FIG. 14, readout from the pixels that belong to Row R0 is performed during the period H0 from time t0 to time t1, readout from the pixels that belong to Row R1 is performed during the period H1 from time t1 to time t2, readout from the pixels that belong to Row R2 is performed during the period H2 from time t2 to time t3, readout from the pixels that belong to Row R3 is performed during the period H3 from time t3 to time t4, readout from the pixels that belong to Row R4 is performed during the period H4 from time t4 to time t5, readout from the pixels that belong to Row R5 is performed during the period H5 from time t5 to time t6, readout from the pixels that belong to Row R6 is performed during the period H6 from time t6 to time t7, and readout from the pixels that belong to Row R7 is performed during a period in the period H7, from time t7 to time tu0. During readout from the pixels that belong to Row R0 to Row R7, the voltage V2 is applied from the voltage supply circuit 32 to the counter electrode 12. Each of the periods H0, H1, H2, H3, H4, H5, and H6 is a 1H period with the duration HS. The period H7 is a 1H period with the duration HL.

At time tu0, the voltage Vb applied from the voltage supply circuit 32 to the counter electrode 12 is changed from the voltage V2 to the voltage V1. Subsequently, at time td0, the voltage Vb is switched to the voltage V2 again. As illustrated in FIG. 14, time tu0 and time td0 belong to the same period H7. Time tu0 is a time after the signal readout period for the pixels that belong to Row R7 has ended. Time td0 is a time before the signal readout period for the pixels that belong to Row R8 starts.

Readout from the pixels that belong to Row R8 to Row R15 is performed in substantially the same manner as readout from the pixels that belong to Row R0 to Row R7.

In the above manner, in the example in FIG. 14, the voltage Vb to be applied to the counter electrode 12 is switched between the voltage V2 and the voltage V1 in a cycle of an eight-rows scanning period. The eight-rows scanning period corresponds to the sum of seven durations HS and one duration HL. From time t0 to time t16, two cycles each corresponding to the eight-rows scanning period appear.

In the example in FIG. 14, while signal readout from the pixels that belong to Row R0 to Row R7 is being performed, the voltage supply circuit 32 maintains the voltage Vb to be applied to the counter electrode 12 at the low voltage V2. Thus, the low-sensitivity exposure state is maintained. After readout from the pixels that belong to Row R7 has ended, the voltage supply circuit 32 switches the voltage Vb from the low voltage V2 to the high voltage V1. Thus, the exposure state is switched from the low-sensitivity exposure state to the high-sensitivity exposure state. The state in which the voltage Vb is the voltage V1 is maintained for a predetermined period. Subsequently, the voltage supply circuit 32 switches the voltage Vb from the voltage V1 to the voltage V2 again.

More specifically, as described above, the 1H period for scanning Row R7 is longer than each of the 1H periods for scanning Row R0 to Row R6. During the long 1H period, readout from the pixels that belong to Row R7 is performed, the voltage Vb is switched from the voltage V2 to the voltage V1, and the voltage Vb is switched from the voltage V1 to the voltage V2.

For Row R8 to Row R15, in substantially the same manner for Row R0 to Row R7, pixel signal readout is performed, and the voltage Vb is switched. In this manner, pixel signal readout is performed, and the voltage Vb is switched in units of eight rows.

In the example in FIG. 14, each high-sensitivity exposure period is longer than that in the example in FIG. 3. Thus, in the example in FIG. 14, the issue of the insufficient sensitivity described with reference to FIG. 8 is more unlikely to arise than in the example in FIG. 3.

On the other hand, in the example in FIG. 3, the high-sensitivity exposure period is dispersed in a larger number of areas than in the example in FIG. 14. Thus, in the example in FIG. 3, it is more likely to capture an appropriate image of a subject that changes over time than in the example in FIG. 14.

It is also possible to change the number of high-sensitivity exposure periods appearing in a certain one frame period and in another one frame period. In other words, it is also possible to change the number of periods during which the voltage Vb is maintained at the voltage V1 in a certain one frame period and in another one frame period. For example, in the example in FIG. 15, there are three periods during which the voltage Vb is maintained at the voltage V1 in one frame period from time tv0 to time tv1. Thus, three high-sensitivity exposure periods appear in the one frame period. On the other hand, there is one period during which the voltage Vb is maintained at the voltage V1 in one frame period from time tv1 to time tv2. Thus, one high-sensitivity exposure period appears in the one frame period.

Figure 15:
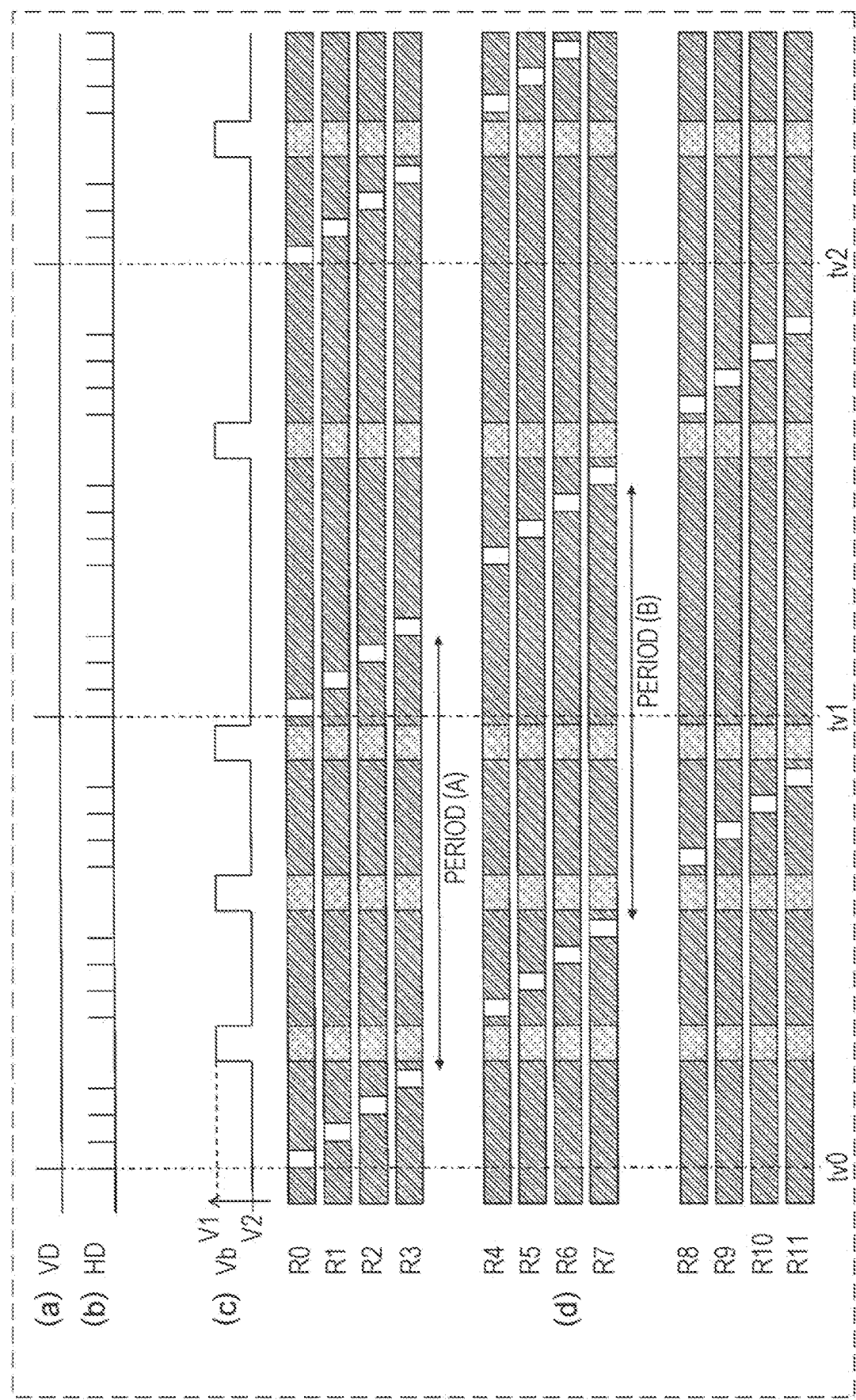
FIG. 15 is a chart for describing the operation of the imaging device.

In the example in FIG. 15, in the one frame period from time tv1 to time tv2, pixel signals read out from the pixels that belong to Row R3 are signals in accordance with charge accumulated in the pixels during a period (A) in FIG. 15. The period (A) is a pixel charge accumulating period in Row R3. In addition, in the same one frame period, pixel signals read out from the pixels that belong to Row R7 are signals in accordance with charge accumulated in the pixels during a period (B) in FIG. 15. The period (B) is a pixel charge accumulating period in Row R7.

In FIG. 15, three high-sensitivity exposure periods appear during the period (A), while two high-sensitivity exposure periods appear during the period (B). In this manner, the number of high-sensitivity exposure periods appearing during the charge accumulating period differs between Row R3 and Row R7. However, even with this difference, it is possible to prevent the sensitivity from becoming uneven according to the row in the pixel array PA on the same screen.

Specifically, for each row in the pixel array PA, a gain can be applied to output signals of pixels. More specifically, a gain in accordance with a ratio Tt/Ta can be applied to the output signals of pixels, the ratio Tt/Ta being a ratio of a total period Tt of the high-sensitivity exposure periods to an accumulating period Ta. Even more specifically, a gain in inverse proportion to the ratio Tt/Ta can be applied to the output signals of pixels. By applying such a gain, the output signals are corrected so as to prevent the sensitivity from becoming uneven according to the row.

In the example in FIG. 15, substantially the same argument as that on Row R3 is applied to Row R0 to Row R2. Substantially the same argument as that on Row R7 is applied to Row R4 to Row R6 and Row R8 to Row R11.

Specifically, in the example in FIG. 15, for example, a 1-time gain can be applied to output signals of the pixels that belong to Row R0 to Row R3, and a 3/2-times gain can be applied to output signals of the pixels that belong to Row R4 to Row R11.

Second Embodiment

Now, the second embodiment will be described. In the second embodiment, substantially the same details as those in the first embodiment may be omitted from description.

Figure 16:
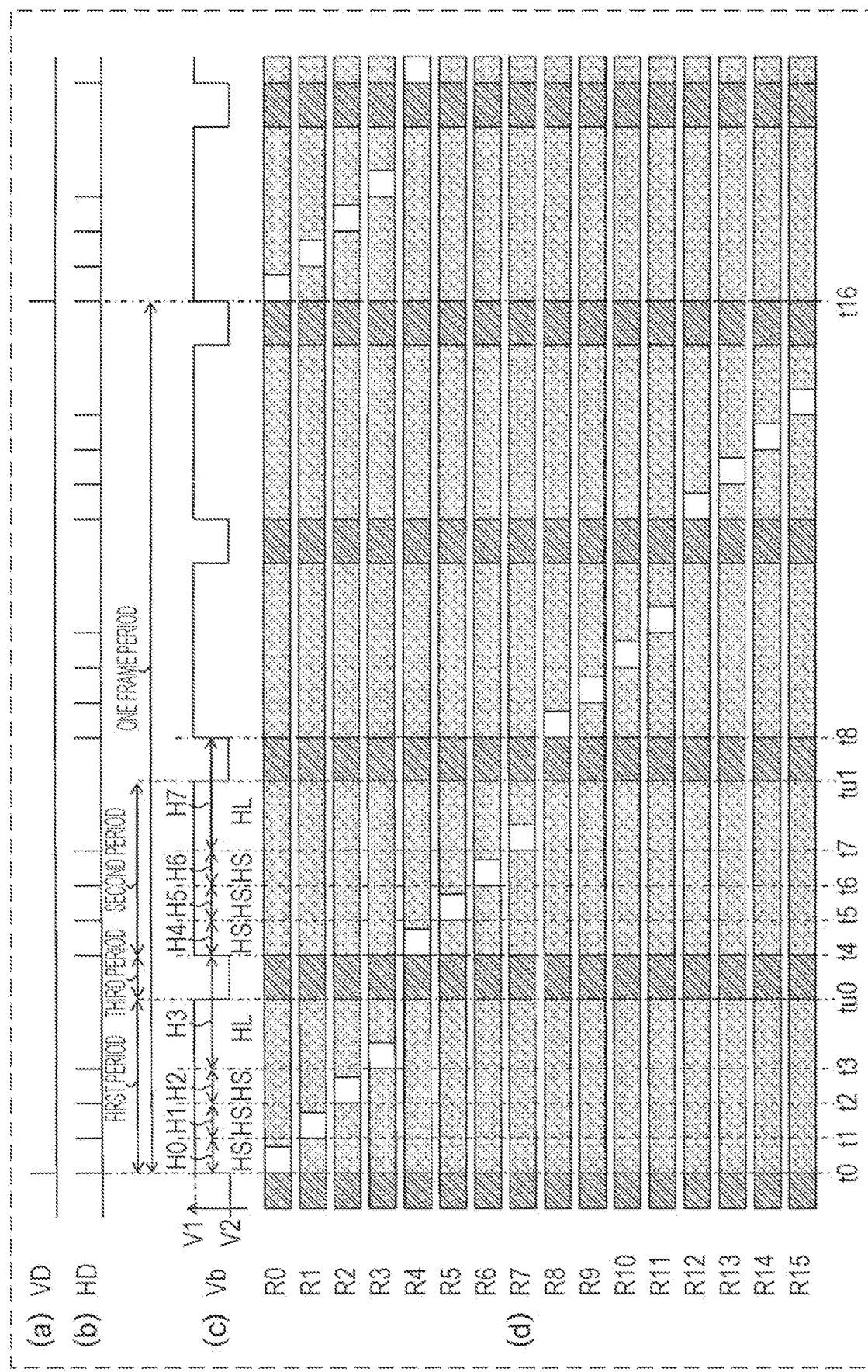
FIG. 16 is a chart for describing the operation of the imaging device.

FIG. 16 is a timing chart illustrating an example of the operation of the imaging device 100 according to the second embodiment. As understood from comparison between FIG. 3 and FIG. 16, in the second embodiment, pixel signal readout is performed during the high-sensitivity exposure period.

Specifically, as illustrated in FIG. 16, readout from the pixels that belong to Row R0 is performed during the period H0 from time t0 to time t1, readout from the pixels that belong to Row R1 is performed during the period H1 from time t1 to time t2, readout from the pixels that belong to Row R2 is performed during the period H2 from time t2 to time t3, and readout from the pixels that belong to Row R3 is performed during a period in the period H3, from time t3 to time tu0. During readout from the pixels that belong to Row R0 to Row R3, the voltage V1 is applied from the voltage supply circuit 32 to the counter electrode 12. Note that, as in the first embodiment, the predetermined voltage Vs is applied from the voltage supply circuit 35 to the shield electrode 17. Each of the periods H0, H1, and H2 is a 1H period with the duration HS. The period H3 is a 1H period with the duration HL.

At time tu0, the voltage Vb applied from the voltage supply circuit 32 to the counter electrode 12 is changed from the voltage V1 to the voltage V2. Subsequently, at time t4, the voltage Vb is switched to the voltage V1 again. Time tu0 is a time after the signal readout period for the pixels that belong to Row R3 has ended.

Readout from the pixels that belong to Row R4 to Row R7 is performed in substantially the same manner as readout from the pixels that belong to Row R0 to Row R3. Specifically, as illustrated in FIG. 16, readout from the pixels that belong to Row R4 is performed during the period H4 from time t4 to time t5, readout from the pixels that belong to Row R5 is performed during the period H5 from time t5 to time t6, readout from the pixels that belong to Row R6 is performed during the period H6 from time t6 to time t7, and readout from the pixels that belong to Row R7 is performed during a period in the period H7, from time t7 to time tu1. During readout from the pixels that belong to Row R4 to Row R7, the voltage V1 is applied from the voltage supply circuit 32 to the counter electrode 12. Each of the periods H4, H5, and H6 is a 1H period with the duration HS. The period H7 is a 1H period with the duration HL.

At time tu1, the voltage Vb applied from the voltage supply circuit 32 to the counter electrode 12 is changed from the voltage V1 to the voltage V2. Subsequently, at time t8, the voltage Vb is switched to the voltage V1 again. Time tu1 is a time after the signal readout period for the pixels that belong to Row R7 has ended.

Readout from the pixels that belong to Row R8 to Row R11 is performed in substantially the same manner as readout from the pixels that belong to Row R0 to Row R3. Readout from the pixels that belong to Row R12 to Row R15 is performed in substantially the same manner as readout from the pixels that belong to Row R0 to Row R3.

In the above manner, in the example in FIG. 16, the voltage Vb to be applied to the counter electrode 12 is switched between the voltage V1 and the voltage V2 in a cycle of a four-rows scanning period. The four-rows scanning period corresponds to the sum of three durations HS and one duration HL. From time t0 to time t16, four cycles each corresponding to the four-rows scanning period appear.

In the example in FIG. 16, while signal readout from the pixels that belong to Row R0 to Row R3 is being performed, the voltage supply circuit 32 maintains the voltage Vb to be applied to the counter electrode 12 at the high voltage V1. Thus, the high-sensitivity exposure state is maintained. After readout from the pixels that belong to Row R3 has ended, the voltage supply circuit 32 switches the voltage Vb from the high voltage V1 to the low voltage V2. Thus, the exposure state is switched from the high-sensitivity exposure state to the low-sensitivity exposure state. The state in which the voltage Vb is the voltage V2 is maintained for a predetermined period. Subsequently, the voltage supply circuit 32 switches the voltage Vb from the voltage V2 to the voltage V1 again.

More specifically, as described above, the 1H period for scanning Row R3 is longer than each of the 1H periods for scanning Row R0 to Row R2. During the long 1H period, readout from the pixels that belong to Row R3 is performed, the voltage Vb is switched from the voltage V1 to the voltage V2, and the voltage Vb is switched from the voltage V2 to the voltage V1.

For Row R4 to Row R7, in substantially the same manner for Row R0 to Row R3, pixel signal readout is performed, and the voltage Vb is switched. The same applies to Row R8 to Row R11, and the same also applies to Row R12 to Row R15. In this manner, pixel signal readout is performed, and the voltage Vb is switched in units of four rows.

The technique of the second embodiment can also be expressed as follows. The imaging device 100 includes the pixel array PA. A first period, a third period, and a second period appear in this order in one frame. During the first period, pixel signal readout is performed on at least one first row in the pixel array PA. During the second period, pixel signal readout is performed on at least one second row in the pixel array PA. At least one of the at least one first row or the at least one second row includes two rows in the pixel array PA. During the third period, no pixel signal readout is performed on the rows in the pixel array PA. Each of the first period and the second period is one of the high-sensitivity exposure period and the low-sensitivity exposure period. The third period is the other of the high-sensitivity exposure period and the low-sensitivity exposure period.

Specifically, in the example in FIG. 16, the period from time t0 to time tu0 may correspond to the first period, the period from time tu0 to time t4 may correspond to the third period, and the period from time t4 to time tu1 may correspond to the second period. The combination of Row R0, Row R1, Row R2, and Row R3 may correspond to the at least one first row. The combination of Row R4, Row R5, Row R6, and Row R7 may correspond to the at least one second row. Each of the first period and the second period is the high-sensitivity exposure period, and the third period is the low-sensitivity exposure period. The first period and the third period are adjacent to each other. The third period and the second period are adjacent to each other.

For the same reasons as those described in the first embodiment with reference to FIGS. 5 to 9, the technique of the second embodiment is suitable for obtaining an appropriate image while maintaining the frame rate.

In the example in FIG. 16, each of the first period and the second period is the high-sensitivity exposure period, and the third period is the low-sensitivity exposure period. Setting these periods in this manner is suitable for image capturing with a high sensitivity. As in FIG. 10, the first period, the second period, and the third period are set in a manner opposite to the above. In this case, if a short low-sensitivity exposure period and a long high-sensitivity exposure period are employed in order to make a sensitivity high, the period Tg is likely to stick out from the low-sensitivity exposure period. This is disadvantageous in terms of obtaining an appropriate image. On the other hand, in FIG. 11, as in FIG. 16, each of the first period and the second period is the high-sensitivity exposure period, and the third period is the low-sensitivity exposure period. In this case, if a short low-sensitivity exposure period and a long high-sensitivity exposure period are employed in order to make a sensitivity high, the period Tg is unlikely to stick out from the high-sensitivity exposure period. From the above, if each timing for pixel signal readout is fixed (i.e., if the frame rate is fixed), it is understood that image degradation due to the above stick-out is likely to be prevented while maintaining a high sensitivity in the example in FIG. 11 compared with the example in FIG. 10.

As described above, it is possible to make the interval between the timings for pixel signal readout longer. In this case, even if each of the first period and the second period is set as the low-sensitivity exposure period and the third period is set as the high-sensitivity exposure period as in FIG. 10, a high sensitivity can be obtained without the above stick-out. Specifically, by employing a long interval and fitting the long high-sensitivity exposure period within the long interval, a high sensitivity can be obtained without the above stick-out. However, if the interval is made longer, it is difficult to maintain the frame rate. Thus, even if the embodiment of changing timings for pixel signal readout is taken into account, the example in FIG. 11 is advantageous over the example in FIG. 10 in obtaining a high sensitivity.

In one frame, the total period of the high-sensitivity exposure period may be longer than or equal to the total period of the low-sensitivity exposure period. This helps image capturing with a high sensitivity. Note that this feature is also applicable to the other embodiments.

It is also possible to form an imaging device that is suitable for both image capturing with a low sensitivity and image capturing with a high sensitivity. In the example in FIG. 17, such an imaging device has a control mode that is either a first mode or a second mode. In the first mode, each of the first period and the second period is the high-sensitivity exposure period, and the third period is the low-sensitivity exposure period. In the second mode, each of the first period and the second period is the low-sensitivity exposure period, and the third period is the high-sensitivity exposure period. The first mode is suitable for image capturing with a high sensitivity. The second mode is suitable for image capturing with a low sensitivity. Thus, such an imaging device can perform image capturing suitable for both cases. Note that the imaging device may also include a control circuit that sets the control mode of the imaging device. The control circuit may be included in the above driving section.

Figure 17:
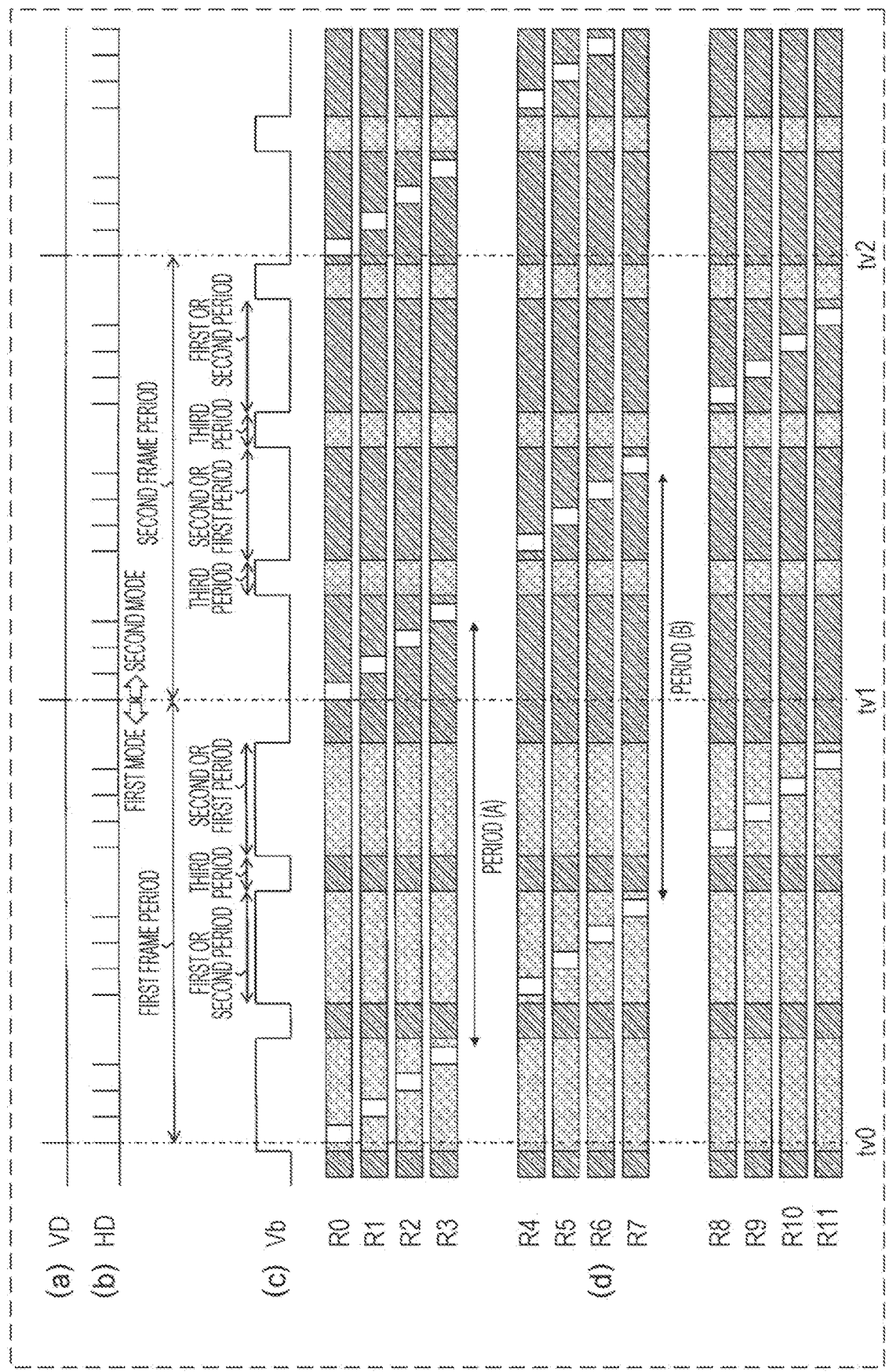
FIG. 17 is a chart for describing the operation of the imaging device.

In the example in FIG. 17, the first mode is switched to the second mode at time tv1. The period during which the first mode is implemented includes the period from time tv0 to time tv1. During this period, a first frame is formed. The period during which the second mode is implemented includes the period from time tv1 to time tv2. During this period, a second frame is formed.

In this example, the first mode and the second mode are switched on the basis of a set value of sensitivity (hereinafter also referred to as set sensitivity). The set value indicates a target value to be obtained by control.

In this example, the set sensitivity is a value that changes depending on the duty ratio and the set value of the potential difference (hereinafter also referred to as set potential difference) between the pixel electrode 11 and the counter electrode 12 during the high-sensitivity exposure period.

Specifically, the set sensitivity increases as the duty ratio increases. The set sensitivity increases as the set potential difference increases. More specifically, the set sensitivity increases in proportion to the duty ratio. The set sensitivity increases non-linearly with respect to the set potential difference. The non-linear increase can be known in advance through experiment or the like.

The non-linear increase will be further described. The light-receiving sensitivity of the photoelectric conversion layer 15 when the potential difference between the pixel electrode 11 and the counter electrode 12 is a certain value is standardized as 1. This sensitivity that is standardized is referred to as standardized sensitivity as in the example in FIG. 12. As in FIG. 12, the standardized sensitivity changes non-linearly with respect to the potential difference between the pixel electrode 11 and the counter electrode 12. In the following description, the set value of the standardized sensitivity may be referred to as set standardized sensitivity. The above certain value (i.e., the potential difference by which the standardized sensitivity becomes 1) may be referred to as potential difference H. The potential difference by which the standardized sensitivity becomes 0 may be referred to as potential difference L. According to the description with reference to FIG. 12, the potential H may be 10 V, and the potential difference L is, for example, 0 V.

In a first example, when the set sensitivity is reduced to less than a switching threshold in the first mode, the first mode is switched to the second mode. When the set sensitivity increases to greater than or equal to the switching threshold in the second mode, the second mode is switched to the first mode. As the switching threshold in the first example, for example, a value greater than or equal to 0.3 and less than or equal to 0.7, specifically, 0.5 may be used.

In a second example, when the set sensitivity is reduced to less than a first threshold in the first mode, the first mode is switched to the second mode. When the set sensitivity increases to greater than or equal to a second threshold in the second mode, the second mode is switched to the first mode. The first threshold is smaller than the second threshold. As the first threshold in the second example, for example, a value greater than or equal to 0.25 and less than or equal to 0.41, specifically, 0.33 may be used. As the second threshold in the second example, for example, a value greater than or equal to 0.42 and less than or equal to 0.58, specifically, 0.5 may be used.

In a specific example, the set potential difference during the low-sensitivity exposure period is set to the potential difference L. Thus, the set standardized sensitivity during the low-sensitivity exposure period is zero. The set sensitivity is a product of the duty ratio and the set standardized sensitivity during the high-sensitivity exposure period. In this specific example, when the duty ratio is 1 (i.e., 100%) and the set standardized sensitivity during the high-sensitivity exposure period is 1 (i.e., 100%), the set sensitivity is 1 (i.e., 100%). The set sensitivity is 0 when the duty ratio is 0, and is also 0 when the set standardized sensitivity is 0. By combining this specific example and the above second example, 0.33 is used as the first threshold, 0.5 is used as the second threshold, and the set standardized sensitivity during the high-sensitivity exposure period is set to 1. In this case, by setting the ratio between the duration of the high-sensitivity exposure period and the duration of the low-sensitivity exposure period in the first mode to 1:2, the set sensitivity can be 0.33 in the first mode.

In the example in FIG. 17, in one frame period from time tv0 to time tv1, image capturing is performed on the first mode. Thus, in the one frame period, each of the first period and the second period is set as the high-sensitivity exposure period, and the third period is set as the low-sensitivity exposure period. On the other hand, in one frame period from time tv1 to time tv2, image capturing is performed on the second mode. Thus, in the one frame period, each of the first period and the second period is set as the low-sensitivity exposure period, and the third period is set as the high-sensitivity exposure period.

In the example in FIG. 17, in the one frame period from time tv1 to time tv2, pixel signals read out from the pixels that belong to Row R3 are signals in accordance with charge accumulated in the pixels during a period (A) in FIG. 17. The period (A) is a pixel charge accumulating period in Row R3. In addition, in the same one frame period, pixel signals read out from the pixels that belong to Row R7 are signals in accordance with charge accumulated in the pixels during a period (B) in FIG. 17. The period (B) is a pixel charge accumulating period in Row R7.

In FIG. 17, two high-sensitivity exposure periods appear during the period (A), and one of these periods is the first period, and the other of these periods is the second period. In contrast, two high-sensitivity exposure periods appear during the period (B), and one of these periods is the first period or the second period, and the other of these periods is the third period. Depending on the duration of each of the first period, the second period, and the third period, the total period of the high-sensitivity exposure periods during the charge accumulating period may differ between Row R3 and Row R7. However, even with this difference, it is possible to prevent the sensitivity from becoming uneven according to the row in the pixel array PA on the same screen.

Specifically, for each row in the pixel array PA, a gain can be applied to output signals of pixels. More specifically, a gain in accordance with a ratio Tt/Ta can be applied to the output signals of pixels, the ratio Tt/Ta being a ratio of a total period Tt of the high-sensitivity exposure periods to an accumulating period Ta. Even more specifically, a gain in inverse proportion to the ratio Tt/Ta can be applied to the output signals of pixels. By applying such a gain, the output signals are corrected so as to prevent the sensitivity from becoming uneven according to the row.

In the example in FIG. 17, substantially the same argument as that on Row R3 is applied to Row R0 to Row R2. Substantially the same argument as that on Row R7 is applied to Row R4 to Row R6.

In the example in FIG. 17, for example, the duration of the first period, the duration of the second period, and the duration of the third period have a ratio of 2:2:1, the set standardized sensitivity during the high-sensitivity exposure period is set to 1, and the set standardized sensitivity during the low-sensitivity exposure period is set to 0. In this case, for example, a 1-time gain can be applied to output signals of the pixels that belong to Row R0 to Row R3, and a 4/3-times gain can be applied to output signals of the pixels that belong to Row R4 to Row R7.

In the examples in FIG. 15 and FIG. 17, in a case where the ratio Tt/Ta in a certain row in the pixel array PA is rat1 and the ratio Tt/Ta in another row is rat2, a ratio of the gain to be applied to the output signals of pixels that belong to the certain row and the gain to be applied to the output signals of pixels that belong to the other row can be set to rat2:rat1. This can prevent the sensitivity in the certain row and the other row in the pixel array PA from becoming uneven. The effect of this prevention is likely to be produced if, in particular, the set standardized sensitivity during the high-sensitivity exposure period is fixed to a certain single value and the set standardized sensitivity during the low-sensitivity exposure period is fixed to another single value. However, this effect may also be produced even if these are not fixed. The ratio Tt/Ta herein is the ratio Tt/Ta of the total period Tt of the high-sensitivity exposure periods to the accumulating period Ta. The accumulating period Ta is an interval period between pixel signal readout and pixel signal readout in a row. The period (A) in FIG. 15 and FIG. 17 may correspond to this interval period. The period (B) in FIG. 15 and FIG. 17 may correspond to this interval period. To apply a gain is a concept including a case where the gain is 1.

Third Embodiment

In the first and second embodiments, the sensitivity is modulated by changing the voltage Vb of the counter electrode 12. However, the sensitivity may also be modulated by changing the voltage of the shield electrode 17, while the voltage of the counter electrode 12 is maintained at a constant voltage. In the third embodiment, the sensitivity is modulated by changing the voltage of the shield electrode 17.

Now, the third embodiment will be described with reference to FIG. 18. In the third embodiment, substantially the same details as those in the first embodiment may be omitted from description. Note that the technique of the third embodiment is applicable not only to the first embodiment but also the other embodiments.

Figure 18:
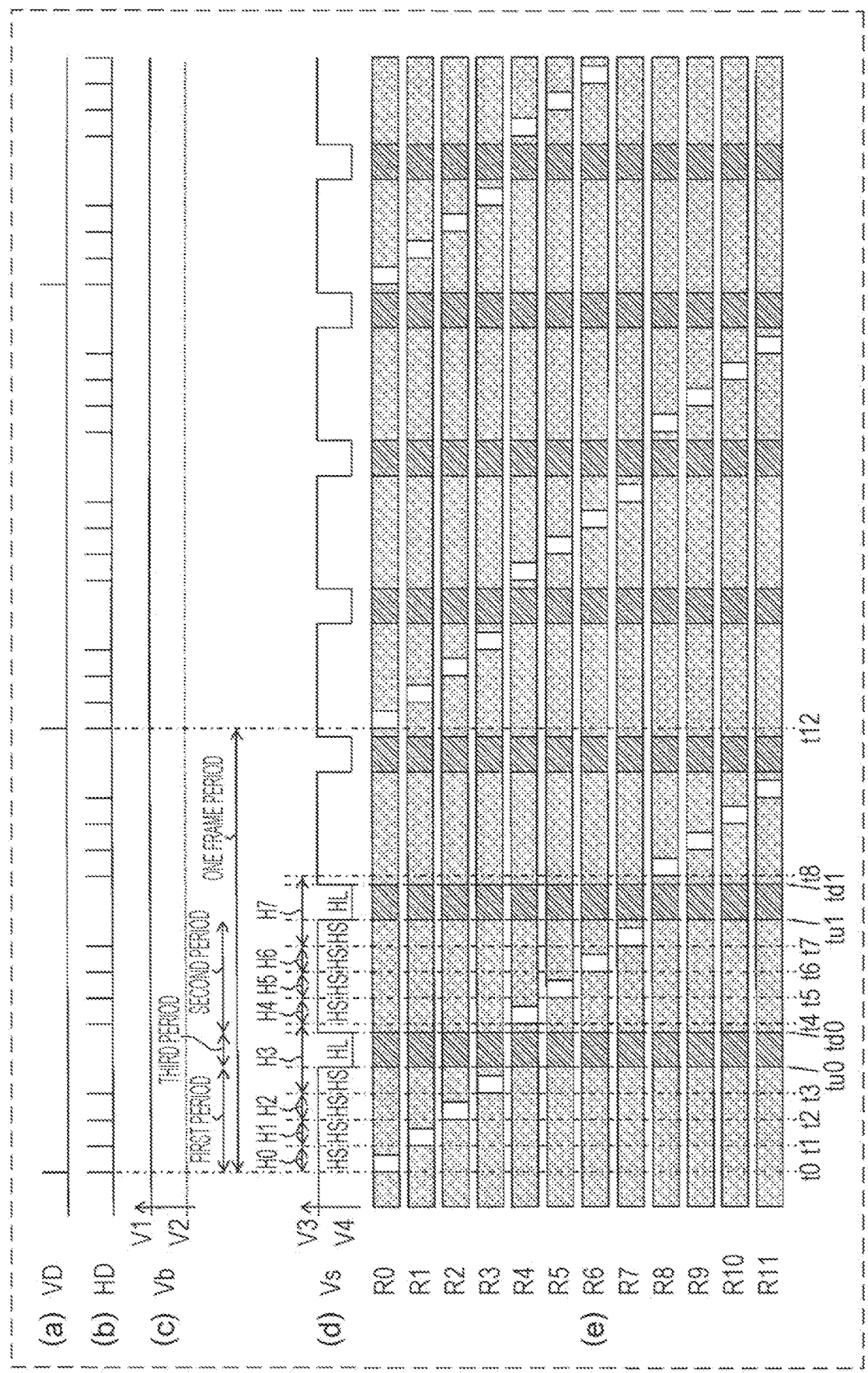
FIG. 18 is a chart for describing the operation of the imaging device.

In the third embodiment, as illustrated in FIG. 18, the voltage supply circuit 32 constantly maintains the voltage Vb of the counter electrode 12 at the voltage V1. On the other hand, the voltage supply circuit 35 changes the voltage Vs of the shield electrode 17 between a voltage V3 and a voltage V4 through the sensitivity control line 45. The voltage V3 is a voltage higher than the voltage V4. The voltage V4 is a voltage lower than the voltage V3. For example, the voltage V3 is higher than the reset voltage Vr, and the voltage V4 is lower than the reset voltage Vr. In addition, for example, the voltage V3 and the voltage V4 are lower than the voltage V1. The reference of the voltage Vs is, for example, the ground potential of the imaging device. The period during which the voltage Vs of the shield electrode 17 is set at the voltage V3 corresponds to the high-sensitivity exposure period, and the period during which the voltage Vs of the shield electrode 17 is set at the voltage V4 corresponds to the low-sensitivity exposure period.

Readout from the pixels that belong to Row R0 is performed during the period H0 from time t0 to time t1, readout from the pixels that belong to Row R1 is performed during the period H1 from time t1 to time t2, readout from the pixels that belong to Row R2 is performed during the period H2 from time t2 to time t3, and readout from the pixels that belong to Row R3 is performed during a period in the period H3, from time t3 to time tu0. During readout from the pixels that belong to Row R0 to Row R3, the voltage V3 is applied to the shield electrode 17. Each of the periods H0, H1, and H2 is a 1H period with the duration HS. The period H3 is a 1H period with the duration HL.

At time tu0, the voltage Vs applied to the shield electrode 17 is changed from the voltage V3 to the voltage V4. Subsequently, at time td0, the voltage Vs is switched to the voltage V3 again. As illustrated in FIG. 18, time tu0 and time td0 belong to the same period H3. Time tu0 is a time after the signal readout period for the pixels that belong to Row R3 has ended. Time td0 is a time before the signal readout period for the pixels that belong to Row R4 starts.

Readout from the pixels that belong to Row R4 to Row R7 is performed in substantially the same manner as readout from the pixels that belong to Row R0 to Row R3. Specifically, as illustrated in FIG. 18, readout from the pixels that belong to Row R4 is performed during the period H4 from time t4 to time t5, readout from the pixels that belong to Row R5 is performed during the period H5 from time t5 to time t6, readout from the pixels that belong to Row R6 is performed during the period H6 from time t6 to time t7, and readout from the pixels that belong to Row R7 is performed during a period in the period H7, from time t7 to time tu1. During readout from the pixels that belong to Row R4 to Row R7, the voltage V3 is applied to the shield electrode 17. Each of the periods H4, H5, and H6 is a 1H period with the duration HS. The period H7 is a 1H period with the duration HL.

At time tu1, the voltage Vs applied to the shield electrode 17 is changed from the voltage V3 to the voltage V4. Subsequently, at time td1, the voltage Vs is switched to the voltage V3 again. As illustrated in FIG. 14, time tu1 and time td1 belong to the same period H7. Time tu1 is a time after the signal readout period for the pixels that belong to Row R7 has ended. Time td1 is a time before the signal readout period for the pixels that belong to Row R8 starts.

Readout from the pixels that belong to Row R8 to Row R11 is performed in substantially the same manner as readout from the pixels that belong to Row R0 to Row R3.

In the above manner, in the example in FIG. 18, the voltage Vs to be applied to the shield electrode 17 is switched between the voltage V3 and the voltage V4 in a cycle of a four-rows scanning period. The four-rows scanning period corresponds to the sum of three durations HS and one duration HL. From time t0 to time t12, three cycles each corresponding to the four-rows scanning period appear.

In the example in FIG. 18, while signal readout from the pixels that belong to Row R0 to Row R3 is being performed, the voltage Vs to be applied to the shield electrode 17 is maintained at the high voltage V3. Thus, the high-sensitivity exposure state is maintained. After readout from the pixels that belong to Row R3 has ended, the voltage Vs is switched from the high voltage V3 to the low voltage V4. Thus, the exposure state is switched from the high-sensitivity exposure state to the low-sensitivity exposure state. The state in which the voltage Vs is the voltage V4 is maintained for a predetermined period. Subsequently, the voltage Vs is switched from the voltage V4 to the voltage V3 again.

More specifically, as described above, the 1H period for scanning Row R3 is longer than each of the 1H periods for scanning Row R0 to Row R2. During the long 1H period, readout from the pixels that belong to Row R3 is performed, the voltage Vs is switched from the voltage V3 to the voltage V4, and the voltage Vs is switched from the voltage V4 to the voltage V3.

For Row R4 to Row R7, in substantially the same manner for Row R0 to Row R3, pixel signal readout is performed, and the voltage Vs is switched. The same applies to Row R8 to Row R11. In this manner, pixel signal readout is performed, and the voltage Vs is switched in units of four rows.

Now, the principle of modulation of the sensitivity in the third embodiment will be described. The sensitivity is modulated by an electric field generated by the potential difference between the pixel electrode 11 and the counter electrode 12 and an electric field generated by the potential difference between the shield electrode 17 and the counter electrode 12.

In the following situation, signal charge is holes, the voltage of the counter electrode 12 is higher than the voltage of the pixel electrode 11, and an electric field from the counter electrode 12 toward the pixel electrode 11 is generated. If the voltage of the shield electrode 17 is high (e.g., higher than the voltage of the pixel electrode 11), the signal charge is unlikely to be captured in the shield electrode 17 and is likely to flow into the pixel electrode 11. Thus, a high sensitivity is obtained. In contrast, if the voltage of the shield electrode 17 is low (e.g., lower than the voltage of the pixel electrode 11), signal charge is likely to be captured in the shield electrode 17 and is unlikely to flow into the pixel electrode 11. Thus, a low sensitivity is obtained. In other words, in the former case, the photoelectric conversion layer 15 is likely to have an appropriate sensitivity in a broader area than in the latter case. For example, during the high-sensitivity exposure period, a magnitude relation in which the voltage of the counter electrode 12 > the voltage of the shield electrode 17 > the voltage of the pixel electrode 11 can be employed. During the low-sensitivity exposure period, a magnitude relation in which the voltage of the counter electrode 12 > the voltage of the pixel electrode 11 > the voltage of the shield electrode 17 can be employed.

In the following situation, signal charge is electrons, the voltage of the pixel electrode 11 is higher than the voltage of the counter electrode 12, and an electric field from the pixel electrode 11 toward the counter electrode 12 is generated. If the voltage of the shield electrode 17 is low (e.g., lower than the voltage of the pixel electrode 11), the signal charge is unlikely to be captured in the shield electrode 17 and is likely to flow into the pixel electrode 11. Thus, a high sensitivity is obtained. In contrast, if the voltage of the shield electrode 17 is high (e.g., higher than the voltage of the pixel electrode 11), signal charge is likely to be captured in the shield electrode 17 and is unlikely to flow into the pixel electrode 11. Thus, a low sensitivity is obtained. In other words, in the former case, the photoelectric conversion layer 15 is likely to have an appropriate sensitivity in a broader area than in the latter case. For example, during the high-sensitivity exposure period, a magnitude relation in which the voltage of the counter electrode 12 < the voltage of the shield electrode 17 < the voltage of the pixel electrode 11 can be employed. During the low-sensitivity exposure period, a magnitude relation in which the voltage of the counter electrode 12 < the voltage of the pixel electrode 11 < the voltage of the shield electrode 17 can be employed.

For example, Japanese Unexamined Patent Application Publication No. 2017-005051 is to be referred to for details of modulation of the sensitivity by using the shield electrode 17.

Both the voltage of the counter electrode 12 and the voltage of the shield electrode 17 can be changed. Also in this manner, the low-sensitivity exposure period and the high-sensitivity exposure period can be set.

The technique of the third embodiment can also be expressed as follows. The imaging device 100 includes the pixel array PA. A first period, a third period, and a second period appear in this order in one frame. During the first period, pixel signal readout is performed on at least one first row in the pixel array PA. During the second period, pixel signal readout is performed on at least one second row in the pixel array PA. At least one of the at least one first row or the at least one second row includes two rows in the pixel array PA. During the third period, no pixel signal readout is performed on the rows in the pixel array PA. Each of the first period and the second period is one of the high-sensitivity exposure period and the low-sensitivity exposure period. The third period is the other of the high-sensitivity exposure period and the low-sensitivity exposure period.

Specifically, in the example in FIG. 18, the period from time t0 to time tu0 may correspond to the first period, the period from time tu0 to time td0 may correspond to the third period, and the period from time td0 to time tu1 may correspond to the second period. The combination of Row R0, Row R1, Row R2, and Row R3 may correspond to the at least one first row. The combination of Row R4, Row R5, Row R6, and Row R7 may correspond to the at least one second row. Each of the first period and the second period is the high-sensitivity exposure period, and the third period is the low-sensitivity exposure period. Specifically, the first period and the third period are adjacent to each other, and the third period and the second period are adjacent to each other.

For the same reasons as those described in the first embodiment with reference to FIGS. 5 to 9, the technique of the third embodiment is suitable for obtaining an appropriate image while maintaining the frame rate.

In the third embodiment, the imaging device 100 includes the voltage supply circuit 35. During the low-sensitivity exposure period, the voltage supply circuit 35 controls the voltage Vs of the shield electrode 17 to a fourth voltage. During the high-sensitivity exposure period, the voltage supply circuit 32 controls the voltage Vs of the shield electrode 17 to a third voltage. The third voltage and the fourth voltage are different from each other. By controlling the voltage of the first electrode 11 in this manner, the sensitivity can be adjusted. The third voltage corresponds to the voltage V3, and the fourth voltage corresponds to the voltage V4.

In the third example, the imaging device 100 collects holes in the pixel electrode 11. Thus, the third voltage is higher than the fourth voltage. However, as described above, the imaging device 100 may also collect, instead of holes, electrons in the pixel electrode 11. In this case, the third voltage may be lower than the fourth voltage.

The imaging device 100 may have an R component and a C component that may change the voltage of the shield electrode 17 in accordance with the time constant determined by the R component and the C component from the start of the third period. The third period is, for example, longer than or equal to twice the time constant. In this manner, during the third period, even if the presence of the time constant is taken into account, the voltage of the shield electrode 17 may be sufficiently close to an expected value. This is advantageous in terms of obtaining a desired sensitivity. The third period may be longer than or equal to three times the time constant. For example, the third period is longer than or equal to 20 µs. The third period is, for example, shorter than or equal to thirty times the time constant. For example, the third period is shorter than or equal to 300 µs.

Similarly, the voltage of the shield electrode 17 changes in accordance with the time constant from the start of the first period. The first period may be longer than or equal to twice or longer than or equal to three times the time constant. The first period may be longer than or equal to 20 µs. The first period may be shorter than or equal to thirty times the time constant. The first period may be shorter than or equal to 300 µs.

Similarly, the voltage of the shield electrode 17 changes in accordance with the time constant from the start of the second period. The second period may be longer than or equal to twice or longer than or equal to three times the time constant. The second period may be longer than or equal to 20 µs. The second period may be shorter than or equal to thirty times the time constant. The second period may be shorter than or equal to 300 µs.

The above R component may include a resistance of the first electrode 11. Specifically, the above R component may include the resistance of the shield electrode 17 and a resistance of the photoelectric conversion layer 15. More specifically, when a voltage supply source for the shield electrode 17 is defined as a power source PS, a voltage output section in the power source PS for the shield electrode 17 is defined as a first end, and the boundary between the photoelectric conversion layer 15 and the second electrode 12 is defined as a second end, the above R component may be a composite resistance of elements that constitute an electrical path from the first end to the second end.

The above C component may include a capacitance of the photoelectric conversion layer 15. Specifically, the above C component may include a capacitance of the shield electrode 17 and the capacitance of the photoelectric conversion layer 15. More specifically, when the voltage supply source for the shield electrode 17 is defined as the power source PS, the voltage output section in the power source PS for the shield electrode 17 is defined as the first end, and the boundary between the photoelectric conversion layer 15 and the second electrode 12 is defined as the second end, the above C component may be a composite capacitance of elements that constitute an electrical path from the first end to the second end.

The time constant that defines the manner of voltage change of the second electrode 12 described in the first embodiment can be referred to as second time constant. The R component and the C component that define the second time constant described in the first embodiment can be referred to as second R component and second C component, respectively. The time constant that defines the manner of voltage change of the shield electrode 17 described in the third embodiment can be referred to as third time constant. The R component and the C component that define the third time constant described in the third embodiment can be referred to as third R component and third C component, respectively.

As understood from the description above, the voltage supply circuit 35 supplies voltage to the shield electrode 17. The voltage supply circuit 35 can set the voltage to different values during the high-sensitivity exposure period and during the low-sensitivity exposure period. In addition, the voltage supply circuit 35 can set the voltage to different values in frames.

The techniques of the first and third embodiments can be expressed together as follows. The imaging device has the following feature (i) and/or (ii). According to feature (i), the imaging device further includes the shield electrode (hereinafter also referred to as third electrode) 17. The semiconductor substrate 20, the third electrode 17, the photoelectric conversion layer 15, and the second electrode 12 are stacked in this order, and the third electrode 17 is controlled to different voltages during the high-sensitivity exposure period and during the low-sensitivity exposure period. According to feature (ii), the second electrode 12 is controlled to different voltages during the high-sensitivity exposure period and during the low-sensitivity exposure period. By controlling the voltage of the electrode in this manner, the sensitivity can be adjusted. The third electrode 17 corresponds to the shield electrode 17.

Specifically, the techniques of the first and third embodiments can be expressed together as follows. The imaging device has the following feature (I) and/or (II). According to feature (I), the imaging device has feature (i) and the third time constant that changes the voltage of the third electrode in accordance with the third time constant, and the third period is longer than or equal to twice the third time constant. According to feature (II), the imaging device has feature (ii) and the second time constant that changes the voltage of the second electrode in accordance with the second time constant, and the third period is longer than or equal to twice the second time constant. In this manner, during the third period, even if the presence of the time constant is taken into account, the voltage(s) of the electrode(s) may be sufficiently close to an expected value. This is advantageous in terms of obtaining a desired sensitivity.

Electronic ND control may also be performed by adjusting the voltage Vs of the shield electrode 17. That is, in this example, the imaging device further includes the shield electrode 17. The semiconductor substrate 20, the shield electrode 17, the photoelectric conversion layer 15, and the second electrode 12 are stacked in this order. The imaging device controls the voltage Vs of the shield electrode 17 to the voltage V3, which is the third voltage, during the high-sensitivity exposure period. The imaging device performs third driving using a third driving voltage as the voltage V3, which is the third voltage, and fourth driving using a fourth driving voltage as the voltage V3, which is the third voltage. The third driving voltage and the fourth driving voltage are different from each other. This example can be implemented by the above-described stack structure.

Fourth Embodiment

Now, a fourth embodiment will be described. In the fourth embodiment, substantially the same details as those in the first embodiment may be omitted from description.

Figure 19:
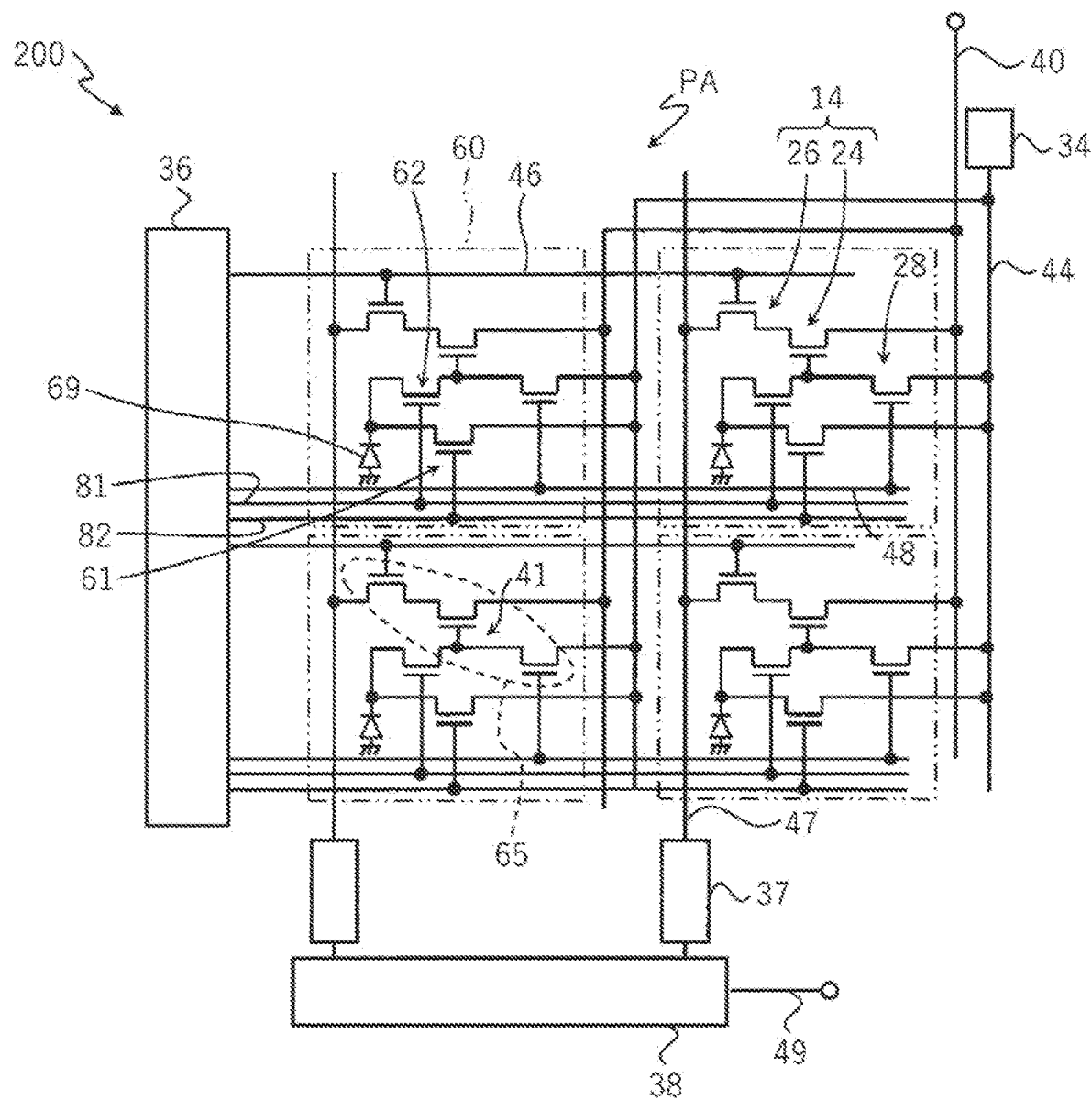
FIG. 19 schematically illustrates an imaging device.

FIG. 19 illustrates an exemplary circuit configuration of an imaging device according to the fourth embodiment. An imaging device 200 illustrated in FIG. 19 includes a pixel array PA including a plurality of unit pixels 60 that are arrayed two-dimensionally. FIG. 19 schematically illustrates an example in which the unit pixels 60 are arranged in a matrix of two rows and two columns. It is needless to say that the number and arrangement of the unit pixels 60 in the imaging device 200 are not limited to those in the example illustrated in FIG. 19.

Each of the unit pixels 60 includes a photoelectric conversion section 69, a shutter gate transistor 61, and a transfer transistor 62.

In each of the unit pixels 60, a readout circuit 65 is configured. The readout circuit 65 includes the address transistor 26, the signal detection transistor 24, and the reset transistor 28.

In this embodiment, the photoelectric conversion section 69 is a photodiode. Specifically, the photoelectric conversion section 69 is an embedded photodiode embedded in a semiconductor substrate. The photoelectric conversion section 69 receives incident light and generates signal charge in accordance with the illuminance. The polarity of signal charge may be positive or negative.

The transfer transistor 62 switches whether signal charge generated by the photoelectric conversion section 69 is to be transferred to the readout circuit 65. Typically, the transfer transistor 62 is an FET. The transfer transistor 62 herein is an N-channel MOS transistor.

A control signal line 81 is connected to a control terminal that is an input of the transfer transistor 62. The control signal line 81 is connected to the vertical scanning circuit 36. The transfer transistor 62 is turned on or off by controlling a voltage level of the control signal line 81. The voltage level is controlled by the vertical scanning circuit 36. By turning on the transfer transistor 62, signal charge generated by the photoelectric conversion section 69 is transferred to the charge accumulation section 41. The charge accumulation section 41 is provided in an area including the transfer transistor 62 and an area between a control terminal of the signal detection transistor 24 and the reset transistor 28.

In the illustrated example, the control terminal of the transfer transistor 62 is a gate. The same applies to the signal detection transistor 24, the address transistor 26, and the shutter gate transistor 61.

The readout circuit 65 detects an electric signal generated by the photoelectric conversion section 69 and transferred to the charge accumulation section 41. As illustrated, the control terminal of the signal detection transistor 24 is connected to an output (one of source and drain) of the transfer transistor 62. A source of the signal detection transistor 24 is connected to a vertical signal line 47 through the address transistor 26. The address control line 46 is connected to the control terminal of the address transistor 26. The address transistor 26 is turned on or off under control of the vertical scanning circuit 36 through the address control line 46.

During the operation of the imaging device 200, the signal detection transistor 24 amplifies and outputs the voltage applied to the control terminal thereof, that is, the voltage of the charge accumulation section 41. The signal amplified by the signal detection transistor 24 is selectively read out as a signal voltage through the address transistor 26 and the vertical signal line 47.

The shutter gate transistor 61 is a shutter gate transistor for the photoelectric conversion section 69. The control terminal of the shutter gate transistor 61 is connected to a shutter gate control line 82 connected to the vertical scanning circuit 36. Thus, the vertical scanning circuit 36 can turn on or off the shutter gate transistor 61. By turning on the shutter gate transistor 61, charge in the photoelectric conversion section 69 is reset, and while the shutter gate transistor 61 is in the on state, a photoelectric conversion operation of the photoelectric conversion section 69 can be stopped. While the shutter gate transistor 61 is in the off state, the photoelectric conversion section 69 is not reset, and a photoelectric conversion operation of the photoelectric conversion section 69 can be performed.

Figure 20:
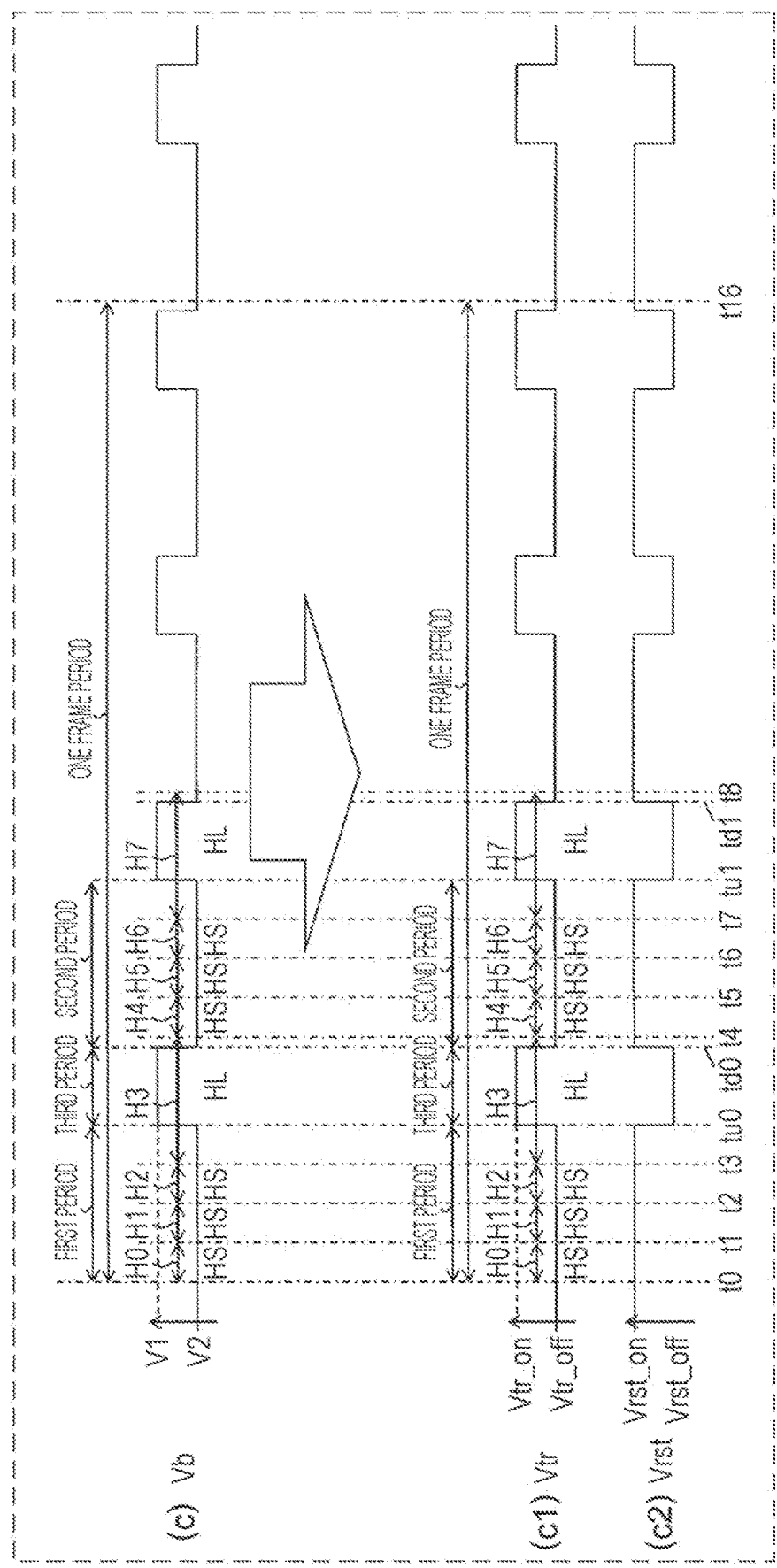
FIG. 20 is a chart for describing the operation of the imaging device.

FIG. 20 is part of a timing chart illustrating an example of the operation of the imaging device 200 according to the fourth embodiment. Specifically, this timing chart example according to the fourth embodiment is obtained by replacing the graph (c) in FIG. 3 with graphs (c1) and (c2) in FIG. 20. Note that FIG. 20 illustrates the graph (c) in FIG. 3 again.

In FIG. 20, the graph (c1) illustrates an example of a temporal change of a voltage Vtr of the control terminal of the transfer transistor 62, and the graph (c2) illustrates an example of a temporal change of a voltage Vrst of the control terminal of the shutter gate transistor 61.

In the example in FIG. 20, the voltage Vtr changes between a voltage Vtr_on and a voltage Vtr_off. While the voltage Vtr is at the voltage Vtr_on, the transfer transistor 62 is maintained in the on state. While the voltage Vtr is at the voltage Vtr_off, the transfer transistor 62 is maintained in the off state. The voltage Vtr_on is higher than the voltage Vtr_off.

The voltage Vrst changes between a voltage Vrst_on and a voltage Vrst_off. While the voltage Vrst is at the voltage Vrst_on, the shutter gate transistor 61 is maintained in the on state. While the voltage Vrst is at the voltage Vrst_off, the shutter gate transistor 61 is maintained in the off state. The voltage Vrst_on is higher than the voltage Vrst_off.

In the example in FIG. 20, while the voltage Vb of the counter electrode 12 in FIG. 3 is at the voltage V1, the voltage Vtr is maintained at the voltage Vtr_on. During this period, the voltage Vrst is maintained at the voltage Vrst_off. While the voltage Vb of the counter electrode 12 in FIG. 3 is at the voltage V2, the voltage Vtr is maintained at the voltage Vtr_off. During this period, the voltage Vrst is maintained at the voltage Vrst_on.

With the voltage Vtr and the voltage Vrst illustrated in FIG. 20, as in a case where the voltage Vb according to the first embodiment illustrated in FIG. 3 is employed, the high-sensitivity exposure period and the low-sensitivity exposure period are generated.

Now, the low-sensitivity exposure period according to the fourth embodiment will be described. In the following situation, the voltage Vrst and the voltage Vtr are maintained at the voltage Vrst_on and the voltage Vtr_off, respectively, during the low-sensitivity exposure period. Ideally, in this situation, charge generated in the photoelectric conversion section 69 does not move to the charge accumulation section 41, and the sensitivity is zero. Such a period during which the sensitivity is zero corresponds to the low-sensitivity exposure period according to the fourth embodiment. On the other hand, if intense light, such as sunlight, is incident on the photoelectric conversion section 69, charge generated in the photoelectric conversion section 69 may flow out, and the flown-out charge may move to the charge accumulation section 41. In addition, in the above case, light incident on the charge accumulation section 41 may be subjected to photoelectric conversion, and charge may be generated. The sensitivity generated in this manner is typically called parasitic light sensitivity. In the fourth embodiment, the period during which the parasitic light sensitivity is generated may also correspond to the low-sensitivity exposure period.

In the example in FIG. 20, the voltage Vrst is maintained at the voltage Vrst_off while the voltage Vtr is at the voltage Vtr_on, and is maintained at the voltage Vrst_on while the voltage Vtr is at the voltage Vtr_off. In other words, the shutter gate transistor 61 is turned on at timing when the transfer transistor 62 is turned off, and is turned off at timing when the transfer transistor 62 is turned on. That is, the voltage Vtr and the voltage Vrst are controlled such that the transfer transistor 62 and the shutter gate transistor 61 are complementarily turned on and off.

However, the voltage Vtr and the voltage Vrst are not necessarily controlled such that the transfer transistor 62 and the shutter gate transistor 61 are complementarily turned on and off. That is, the period during which the voltage Vtr is at the voltage Vtr_on does not necessarily correspond with the period during which the voltage Vrst is at the voltage Vrst_off. The period during which the voltage Vtr is at the voltage Vtr_off does not necessarily correspond with the period during which the voltage Vrst is at the voltage Vrst_on. The timing when the transfer transistor 62 is turned off does not necessarily correspond with the timing when the shutter gate transistor 61 is turned on. The timing when the transfer transistor 62 is turned on does not necessarily correspond with the timing when the shutter gate transistor 61 is turned off.

The technique of the fourth embodiment can also be expressed as follows. The imaging device 200 includes the pixel array PA. A first period, a third period, and a second period appear in this order in one frame. During the first period, pixel signal readout is performed on at least one first row in the pixel array PA. During the second period, pixel signal readout is performed on at least one second row in the pixel array PA. At least one of the at least one first row or the at least one second row includes two rows in the pixel array PA. During the third period, no pixel signal readout is performed on the rows in the pixel array PA. Each of the first period and the second period is one of the low-sensitivity exposure period and the high-sensitivity exposure period.

The third period is the other of the low-sensitivity exposure period and the high-sensitivity exposure period.

Specifically, in the example in FIG. 20, each of the first period and the second period is the low-sensitivity exposure period, and the third period is the high-sensitivity exposure period. However, each of the first period and the second period may be the high-sensitivity exposure period, and the third period may be the low-sensitivity exposure period. In this case, the shutter gate transistor 61 and the transfer transistor 62 may be controlled to be turned on and off at timing inverse to that in FIG. 20.

In the example in FIG. 20, the imaging device 200 includes a semiconductor substrate and the photoelectric conversion section 69. The photoelectric conversion section 69 is an embedded photodiode that is embedded in the semiconductor substrate.

Specifically, the imaging device 200 includes the shutter gate transistor (hereinafter also referred to as first transistor) 61, the charge accumulation section 41, and the transfer transistor (hereinafter also referred to as second transistor) 62. The first transistor 61 resets the embedded photodiode. The charge accumulation section 41 accumulates charge generated by the embedded photodiode. The second transistor 62 transfers charge from the embedded photodiode to the charge accumulation section 41. The high-sensitivity exposure period is a period from turning off of the first transistor 61 until turning off of the second transistor 62. The low-sensitivity exposure period is a period from turning off of the second transistor 62 until turning off of the first transistor 61. In the example in FIG. 19, the first transistor 61 corresponds to the shutter gate transistor 61, and the second transistor 62 corresponds to the transfer transistor 62.

First Reference Embodiment

Now, a first reference embodiment will be described. In the first reference embodiment, substantially the same details as those in the first embodiment may be omitted from description.

Figure 21:
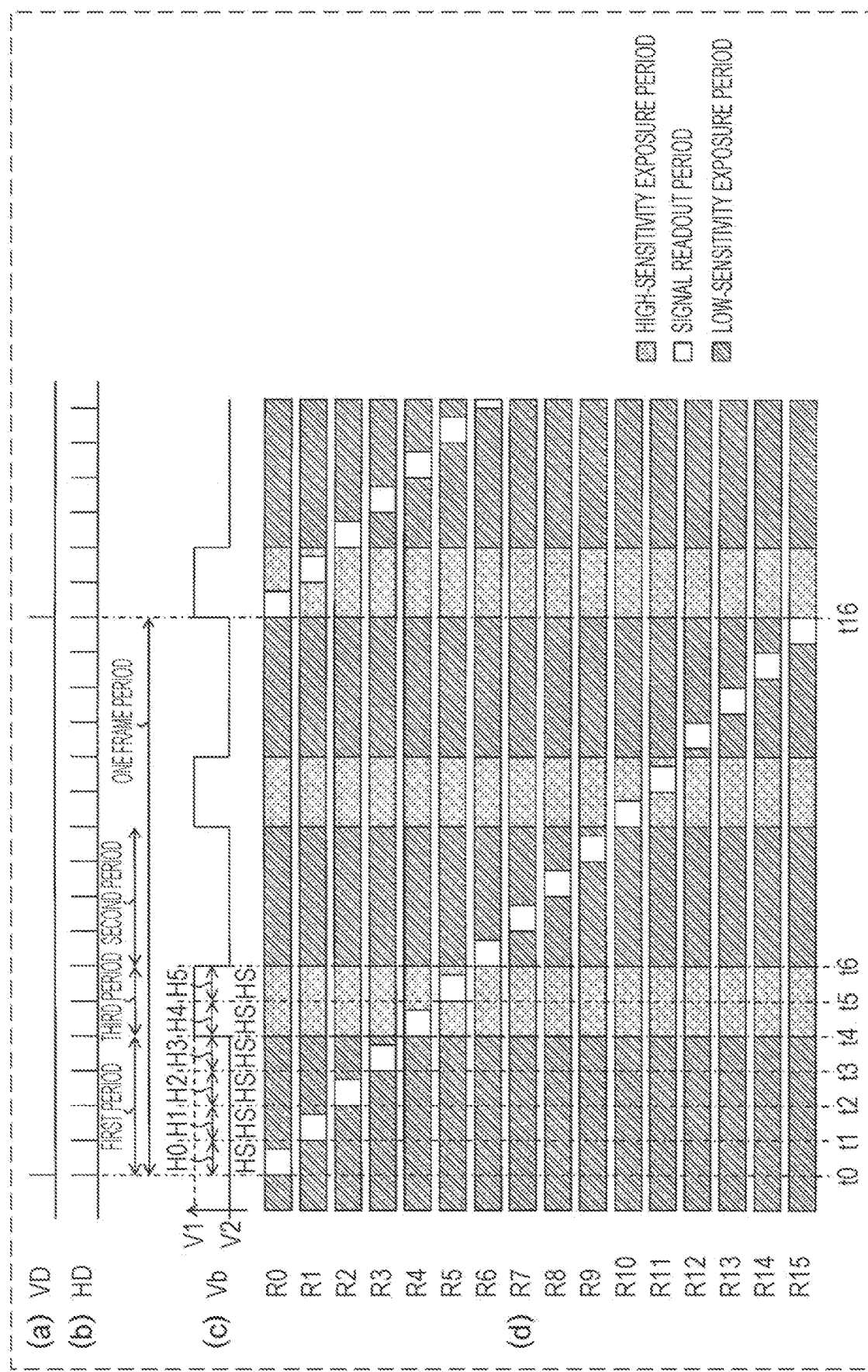
FIG. 21 is a chart for describing the operation of an imaging device.

FIG. 21 is a timing chart illustrating an example of the operation of an imaging device according to the first reference embodiment.

Specifically, in the example in FIG. 21, readout from the pixels that belong to Row R0 is performed during the period H0 from time t0 to time t1, readout from the pixels that belong to Row R1 is performed during the period H1 from time t1 to time t2, readout from the pixels that belong to Row R2 is performed during the period H2 from time t2 to time t3, readout from the pixels that belong to Row R3 is performed during the period H3 from time t3 to time t4, readout from the pixels that belong to Row R4 is performed during the period H4 from time t4 to time t5, and readout from the pixels that belong to Row R5 is performed during the period H5 from time t5 to time t6. During readout from the pixels that belong to Row R0 to Row R3, the voltage supply circuit 32 applies the voltage V2 to the counter electrode 12. During readout from the pixels that belong to Row R4 and Row R5, the voltage supply circuit 32 applies the voltage V1 to the counter electrode 12. Each of the periods H0, H1, H2, H3, H4, and H5 is a 1H period with the duration HS.

At time t4, the voltage Vb applied from the voltage supply circuit 32 to the counter electrode 12 is changed from the voltage V2 to the voltage V1. Subsequently, at time t6, the voltage Vb is switched to the voltage V2 again.

Readout from the pixels that belong to Row R6 to Row R11 is performed in substantially the same manner as readout from the pixels that belong to Row R0 to Row R5. Readout from the pixels that belong to Row R12 to Row R15 is performed in substantially the same manner as readout from the pixels that belong to Row R0 to Row R3.

In the above manner, in the example in FIG. 21, the voltage Vb to be applied to the counter electrode 12 is switched between the voltage V1 and the voltage V2 in a cycle of a six-rows scanning period. The six-rows scanning period corresponds to the sum of five durations HS and one duration HL.

In the example in FIG. 21, while signal readout from the pixels that belong to Row R0 to Row R3 is being performed, the voltage supply circuit 32 maintains the voltage Vb to be applied to the counter electrode 12 at the low voltage V2. Thus, the low-sensitivity exposure state is maintained. After readout from the pixels that belong to Row R3 has ended, the voltage supply circuit 32 switches the voltage Vb from the low voltage V2 to the high voltage V1. Thus, the exposure state is switched from the low-sensitivity exposure state to the high-sensitivity exposure state. While signal readout from the pixels that belong to Row R4 and Row R5 is being performed, the voltage supply circuit 32 maintains the voltage Vb to be applied to the counter electrode 12 at the high voltage V1. Subsequently, the voltage supply circuit 32 switches the voltage Vb from the voltage V1 to the voltage V2 again.

For Row R6 to Row R11, in substantially the same manner for Row R0 to Row R5, pixel signal readout is performed, and the voltage Vb is switched. For Row R12 to Row R15, in substantially the same manner for Row R0 to Row R3, pixel signal readout is performed.

The technique of the first reference embodiment can be expressed as follows. The imaging device 100 includes the pixel array PA. The first period and the third period appear in this order in one frame. During the first period, pixel signal readout is performed on at least one first row in the pixel array PA. During the third period, pixel signal readout is performed on at least one third row in the pixel array PA. There is no row in the pixel array PA on which pixel signal readout is performed over a period across the boundary between the first period and the third period. The first period is one of the high-sensitivity exposure period and the low-sensitivity exposure period. The third period is the other of the high-sensitivity exposure period and the low-sensitivity exposure period. Note that the at least one first row and the at least one third row do not overlap with each other.

According to the first reference embodiment, pixel signal readout is performed during both the first period and the third period. This is suitable for maintaining the frame rate. In addition, according to the first reference embodiment, there is no row in the pixel array PA on which pixel signal readout is performed over a period across the boundary between the first period and the third period. This is suitable for obtaining an appropriate image. For the above reasons, the technique of the first reference embodiment is suitable for obtaining an appropriate image while maintaining the frame rate.

In the example in FIG. 21, the first period, the third period, and the second period appear in this order in one frame. During the second period, pixel signal readout is performed on at least one second row in the pixel array PA. There is no row in the pixel array PA on which pixel signal readout is performed over a period across the boundary between the third period and the second period. The second period is one of the high-sensitivity exposure period and the low-sensitivity exposure period. This is suitable for obtaining an appropriate image while maintaining the frame rate.

Note that the at least one first row, the at least one second row, and the at least one third row do not overlap with one another.

The at least one first row may include one or more rows. The at least one third row may include one or more rows. The at least one second row may include one or more rows.

In the example in FIG. 21, each of the first period and the second period is the low-sensitivity exposure period, and the third period is the high-sensitivity exposure period. However, each of the first period and the second period may be the high-sensitivity exposure period, and the third period may be the low-sensitivity exposure period.

The technique of the first reference embodiment may be combined as appropriate with the technique of any other embodiments.

The imaging device according to any of embodiments of the present disclosure is applicable to various camera systems and sensor systems such as a digital still camera, a medical camera, a surveillance camera, an in-vehicle camera, a digital single-lens reflex camera, and a digital mirrorless single-lens camera.

What is claimed is:

1. An imaging device comprising:
    a pixel array including first pixels in at least one first row and second pixels in at least one second row;
    first circuitry configured to:
        supply a first voltage to the first pixels and the second pixels in a first period in one frame period to set the first pixels and the second pixels to a first sensitivity;
        supply a second voltage to the first pixels and the second pixels in a third period immediately subsequent to the first period in the one frame period to set the first pixels and the second pixels to a second sensitivity, the second voltage being different from the first voltage, the second sensitivity being different from the first sensitivity; and
        supply the first voltage to the first pixels and the second pixels in a second period immediately subsequent to the third period in the one frame period to set the first pixels and the second pixels to the first sensitivity; and
    second circuitry configured to:
        in the first period, perform pixel signal readout on the first pixels; and
        in the second period, perform pixel signal readout on the second pixels,
    wherein at least one selected from the group consisting of the at least one first row and the at least one second row includes two rows in the pixel array.

2. The imaging device according to claim 1,
    wherein the at least one first row includes two rows, and
    wherein the at least one second row includes two rows.

3. The imaging device according to claim 2, wherein the at least one first row is constituted by rows a number of which is equal to a number of rows constituting the at least one second row.

4. The imaging device according to claim 1,
    wherein the first sensitivity is higher than the second sensitivity.

5. The imaging device according to claim 1,
    wherein the first sensitivity is lower than the second sensitivity.

6. The imaging device according to claim 1,
    wherein the imaging device has a control mode that is either a first mode or a second mode,
    wherein, in the first mode, the first sensitivity is higher than the second sensitivity, and
    wherein, in the second mode, the first sensitivity is lower than the second sensitivity.

7. The imaging device according to claim 1,
    wherein the first circuitry is configured to alternately supply the first voltage and the second voltage to the pixel array, and
    wherein a total period in which the first voltage is supplied to the pixel array in the one frame period is longer than or equal to a total period in which the second voltage is supplied to the pixel array in the one frame period.

8. The imaging device according to claim 1,
    wherein the first circuitry is configured to alternately supply the first voltage and the second voltage to the pixel array, and
    wherein a total period in which the first voltage is supplied to the pixel array is shorter than a total period in which the second voltage is supplied to the pixel array in the one frame period.

9. The imaging device according to claim 1, further comprising:
    a semiconductor substrate,
    wherein the first pixels and the second pixels each include a photoelectric converter that includes a photoelectric conversion layer, a first electrode, and a second electrode, and
    wherein the semiconductor substrate, the first electrode, the photoelectric conversion layer, and the second electrode are stacked in this order.

10. The imaging device according to claim 9, having at least one of the following features:
    (i) the photoelectric converter further includes a third electrode, the semiconductor substrate, the third electrode, the photoelectric conversion layer, and the second electrode are stacked in this order, and the first circuitry is configured to supply the first voltage and the second voltage to the third electrode; and
    (ii) the first circuitry is configured to supply the first voltage and the second voltage to the second electrode.

11. The imaging device according to claim 10, having at least one of the following features:
    (I) in the feature (i), the third period is longer than or equal to twice a time constant in voltage change of the third electrode, and
    (II) in the feature (ii), the third period is longer than or equal to twice a time constant in voltage change of the second electrode.

12. An imaging method using an imaging device including a pixel array including first pixels in at least one first row and second pixels in at least one second row, the method comprising:
    supplying a first voltage to the first pixels and the second pixels in a first period in one frame period to set the first pixels and the second pixels to a first sensitivity;
    supplying a second voltage to the first pixels and the second pixels in a third period immediately subsequent to the first period in the one frame period to set the first pixels and the second pixels to a second sensitivity, the second voltage being different from the first voltage, the second sensitivity being different from the first sensitivity;
    supplying the first voltage to the first pixels and the second pixels in a second period immediately subsequent to the third period in the one frame period to set the first pixels and the second pixels to the first sensitivity;
    in the first period, performing pixel signal readout on the first pixels; and in the second period, performing pixel signal readout on the second pixels, wherein at least one selected from the group consisting of the at least one first row and the at least one second row includes two rows in the pixel array.

13. An imaging device comprising:
a signal line;
pixels, each of the pixels generating a pixel signal in accordance with an amount of incident light and outputting the pixel signal to the signal line; and
a voltage supply circuit that supplies a first voltage and a second voltage to the pixels, the first voltage and the second voltage being different from each other and being supplied alternately twice or more in a frame period,
wherein each of the pixels includes
a photoelectric converter that converts light into an electric signal with a first sensitivity in first periods and with a second sensitivity in second periods, the first voltage being supplied in the first periods, the second voltage being supplied in the second periods, the first sensitivity and the second sensitivity being different from each other, and
a first transistor that amplifies the electric signal to output the pixel signal, and
wherein each of two or more pixels among the pixels sequentially output the pixel signal to the signal line in same one of the first periods.

14. The imaging device according to claim 13, wherein each of the pixels outputs the pixel signal to the signal line in any one of the first periods.

15. The imaging device according to claim 13, wherein each of the pixels does not output the pixel signal to the signal line in any one of the second periods.

16. The imaging device according to claim 13,
wherein the photoelectric converter includes
a first electrode configured to be electrically connected to a gate of the first transistor,
a second electrode facing the first electrode, and
a photoelectric conversion layer between the first electrode and the second electrode, and
wherein the voltage supply circuit alternately supplies the first voltage and the second voltage to the second electrode.

17. The imaging device according to claim 13,
wherein the photoelectric converter includes
a photoelectric conversion layer having a first surface and a second surface, the first surface and the second surface being opposite to each other,
a first electrode located on the first surface,
a third electrode located on the first surface, and
a second electrode located on the second surface and facing the first electrode and the third electrode,
wherein the first electrode is configured to be electrically connected to a gate of the first transistor, and
wherein the voltage supply circuit alternately supplies the first voltage and the second voltage to the third electrode.

18. The imaging device according to claim 13,
wherein the photoelectric converter includes a photodiode,
wherein each of the pixels includes
a second transistor having a source and a drain, one of the source and the drain being configured to be electrically connected to the photodiode, the other of the source and the drain being configured to be electrically connected to a gate of the first transistor, and
a third transistor having a source and a drain, one of the source and the drain being configured to be electrically connected to the photodiode, the other of the source and the drain being configured to be supplied with a predetermined voltage, and
wherein the voltage supply circuit alternately supplies the first voltage and the second voltage to a gate of the third transistor.

19. The imaging device according to claim 18, wherein the voltage supply circuit alternately supplies a third voltage and a fourth voltage to a gate of the second transistor, the third voltage and the fourth voltage being different from each other.

20. The imaging device according to claim 13, further comprising:
a first control circuit that causes the voltage supply circuit to supply the first voltage and the second voltage; and
a second control circuit that causes each of the pixels to output the pixel signal to the signal line.

* * * * *